(12) United States Patent
Wan et al.

(10) Patent No.: US 12,170,182 B2
(45) Date of Patent: Dec. 17, 2024

(54) RIBBON BEAM ANGLE ADJUSTMENT IN AN ION IMPLANTATION SYSTEM

(71) Applicant: Advanced Ion Beam Technology, Inc., Hsin-Chu (TW)

(72) Inventors: Zhimin Wan, Hsin-Chu (TW); Chi-ming Huang, Hsin-Chu (TW); Shao-Yu Hu, Hsin-Chu (TW)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 769 days.

(21) Appl. No.: 17/366,308

(22) Filed: Jul. 2, 2021

(65) Prior Publication Data
US 2023/0005701 A1 Jan. 5, 2023

(51) Int. Cl.
*H01J 37/20* (2006.01)
*H01J 37/147* (2006.01)
*H01J 37/317* (2006.01)
*H01L 21/265* (2006.01)

(52) U.S. Cl.
CPC .......... *H01J 37/1478* (2013.01); *H01J 37/20* (2013.01); *H01J 37/3171* (2013.01); *H01L 21/26506* (2013.01); *H01J 2237/152* (2013.01); *H01J 2237/2007* (2013.01); *H01J 2237/24564* (2013.01)

(58) Field of Classification Search
CPC .... H01J 37/1478; H01J 37/20; H01J 37/3171; H01J 2237/152; H01J 2237/2007; H01J 2237/24564; H01J 2237/1501; H01J 37/1471; H01J 37/3211; H01J 37/141; H01J 37/08; H01J 37/1475; H01J 37/304; H01J 2237/141; H01L 21/26506
USPC ............................................ 250/492.1–492.3
See application file for complete search history.

(56) References Cited

U.S. PATENT DOCUMENTS

| | | | | |
|---|---|---|---|---|
| 9,340,870 B2 * | 5/2016 | Bai | ...................... | H01J 37/1475 |
| 9,697,988 B2 * | 7/2017 | Wan | ...................... | H01J 37/3007 |
| 2005/0017202 A1 * | 1/2005 | White | ................ | H01J 37/1471 |
| | | | | 250/492.21 |
| 2006/0169924 A1 * | 8/2006 | Purser | ..................... | H01J 37/14 |
| | | | | 250/492.21 |
| 2007/0170369 A1 * | 7/2007 | Purser | ................. | H01J 37/3007 |
| | | | | 250/398 |
| 2009/0189096 A1 * | 7/2009 | Chen | ....................... | H01J 37/08 |
| | | | | 250/492.21 |
| 2014/0212595 A1 * | 7/2014 | Bai | ..................... | H01J 37/3171 |
| | | | | 427/523 |
| 2015/0200073 A1 * | 7/2015 | Jen | ..................... | H01J 37/3171 |
| | | | | 250/281 |

* cited by examiner

*Primary Examiner* — Michael Maskell
(74) *Attorney, Agent, or Firm* — DLA Piper LLP (US)

(57) ABSTRACT

The present disclosure relates generally to ion implantation, and more particularly, to systems and processes for adjusting a ribbon beam angle of an ion implantation system. An exemplary ion implantation system includes an ion source configured to generate a ribbon beam, a wafer chuck configured to hold a wafer during implantation by the ribbon beam, a dipole magnet disposed between the ion source and the wafer chuck, and a controller. The dipole magnet includes at least two coils configured to adjust a ribbon beam angle of the ribbon beam at one or more locations along a path of the ribbon beam between the ion source and the wafer held in the wafer chuck. The controller is configured to control the ion source, the wafer chuck, and the dipole magnet.

35 Claims, 12 Drawing Sheets

RIBBON BEAM ANGLE ADJUSTMENT IN AN ION IMPLANTATION SYSTEM

BACKGROUND

1. Field

The present disclosure relates generally to ion implantation, and more particularly, to systems and processes for adjusting the ribbon beam angle of a ribbon beam within an ion implantation system.

2. Related Art

In semiconductor device fabrication, the physical and/or electrical properties of a semiconductor wafer (also known as a semiconductor substrate) may be modified through a process known as ion implantation. Ion implantation may be performed using an ion implantation system, which may include an ion implantation system that generates an ion beam to implant a wafer with ions. The ion beam generated by an ion implantation system may be a ribbon beam, a type of ion beam made up of several beamlets. The angles between the various beamlets of the ribbon beam may be important at various locations within the ion implantation system depending on which sub-modules of the ion implantation system the ribbon beam is passing through. Accordingly, efficient and accurate techniques for adjusting the ribbon beam angles during the ion implantation process are desirable.

BRIEF SUMMARY

The present disclosure relates to ion implantation systems and processes. An exemplary ion implantation system includes an ion source configured to generate a ribbon beam, a wafer chuck configured to hold a wafer during implantation by the ribbon beam, a dipole magnet disposed between the ion source and the wafer chuck, and a controller. The dipole magnet includes at least two coils configured to adjust a ribbon beam angle of the ribbon beam at one or more locations along a path of the ribbon beam between the ion source and the wafer held in the wafer chuck. A first current is applied to a first coil of the at least two coils and a second current is applied to a second coil of the at least two coils. The ribbon beam angle is an angle between a first beamlet and a second beamlet of the ribbon beam and the first beamlet and the second beamlet are adjacent beamlets of the ribbon beam. The controller is configured to control the ion source, the wafer chuck, and the dipole magnet.

An exemplary non-transitory computer-readable storage medium includes one or more programs, the one or more programs comprising instructions, which when executed by one or more processors of a controller of an ion implantation system, cause the controller to cause an ion source of the ion implantation system to deliver a ribbon beam to a wafer held in a wafer chuck of the ion implantation system, and adjust a ribbon beam angle of the ribbon beam with a dipole magnet including at least two coils at one or more locations along a path of the ribbon beam between the ion source and the wafer held in the wafer chuck, wherein a first current is applied to a first coil of the at least two coils and wherein a second current is applied to a second coil of the at least two coils, wherein the ribbon beam angle is an angle between a first beamlet and a second beamlet of the ribbon beam, and wherein the first beamlet and the second beamlet are adjacent beamlets of the ribbon beam.

An exemplary method for providing a ribbon beam to a wafer in an ion implantation system, the ion implantation system including a an ion source, a wafer chuck configured to hold the wafer, a dipole magnet including at least two coils disposed between the ion source and the wafer chuck, and a controller configured to control the ion source, the wafer chuck, and the dipole magnet including delivering the ribbon beam with the ion source to the wafer held in the wafer chuck, and adjusting a ribbon beam angle of the ribbon beam with the dipole magnet at one or more locations along a path of the ribbon beam between the ion source and the wafer held in the wafer chuck by applying a first current to a first coil of the at least two coils and a second current to a second coil of the at least two coils, wherein the ribbon beam angle is an angle between a first beamlet and a second beamlet of the ribbon beam, and wherein the first beamlet and the second beamlet are adjacent beamlets of the ribbon beam

DETAILED DESCRIPTION

The following description is presented to enable a person of ordinary skill in the art to make and use the various embodiments. Descriptions of specific systems, devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Systems and processes for efficiently and accurately adjusting the ribbon beam angle of a ribbon beam throughout an ion implantation system are provided. In particular, the present disclosure describes systems and processes for adjusting the ribbon beam angle with the use of various dipole magnets before and after a magnetic analyzer, multipole magnets, and other components of the ion implantation system. These systems and processes allow for more precise control of the ribbon beam angle and thus the ribbon beam throughout the ion implantation system. This in turn allows for greater flexibility in the ion implantation system while providing the desired ion implantation to the wafer.

Figure 1:
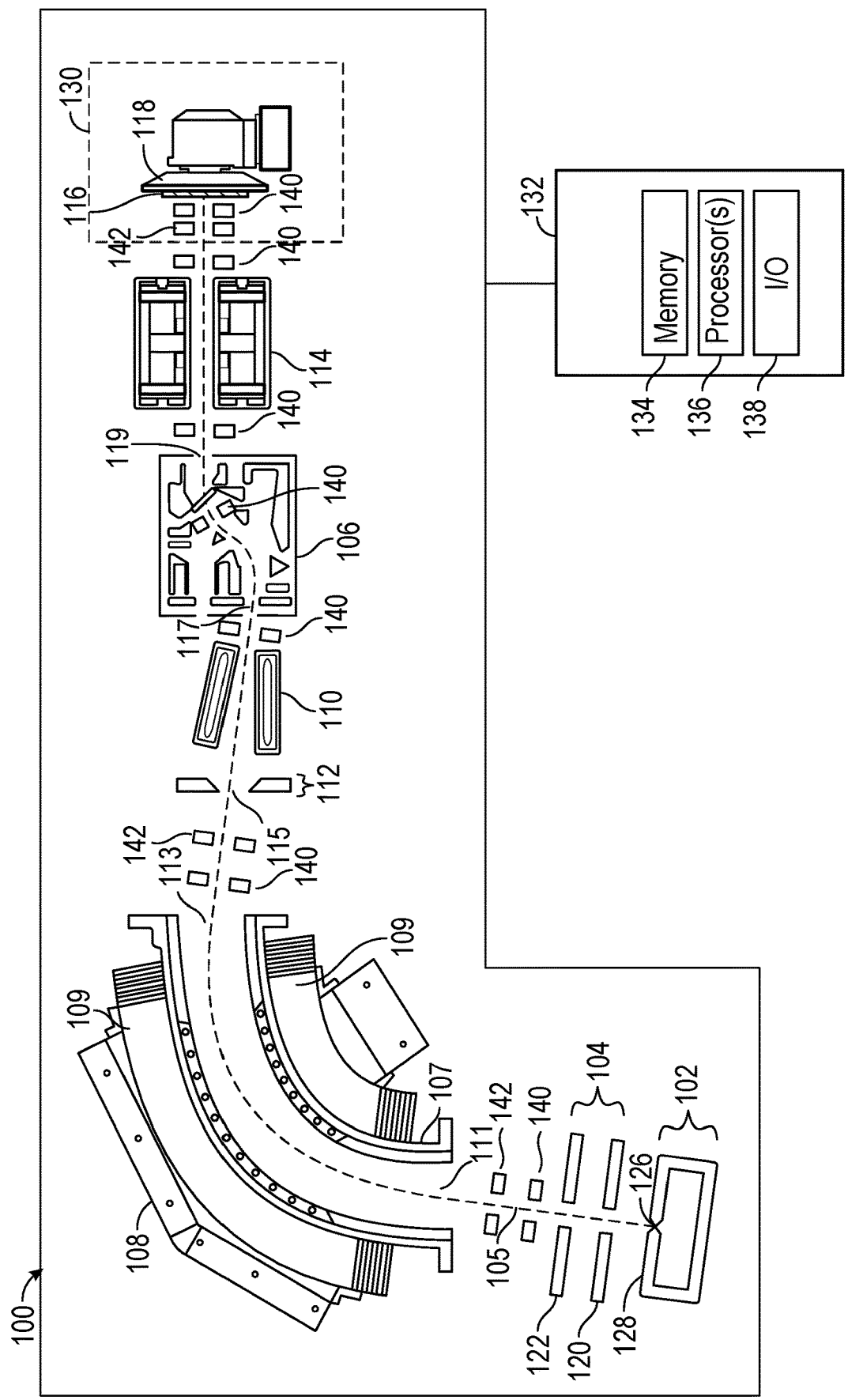
FIG. 1 illustrates a two-dimensional, top-down perspective view of an ion implantation system, according to various examples.

FIG. 1 illustrates a two-dimensional, top-down perspective view of an ion implantation system, according to various examples. As shown, ion implantation system 100 includes ion source 102 and extraction manipulator 104 for generating ribbon beam 105. Extraction manipulator 104 extracts ribbon beam 105 from ion source 102 and directs ribbon beam 105 into magnetic analyzer 108 where ribbon beam 105 is filtered by mass, charge, and/or energy. Ribbon beam 105 is further directed through multipole magnets 110, electrode assembly 106, and multipole magnets 114 to adjust the energy, shape, direction, angle, and/or uniformity of ribbon beam 105. In particular, electrode assembly 106 is configured to adjust the energy of ribbon beam 105, remove neutral species from ribbon beam 105, and/or adjust the size, shape, and uniformity of ribbon beam 105. Multipole magnets 110 and 114 are configured to adjust the uniformity, center angle, and/or divergence angle of ribbon beam 105. Variable aperture assembly 112 is positioned between multipole magnets 110 and magnetic analyzer 108. Variable aperture assembly 112 is configured to adjust the ion current of ribbon beam 105. Ion implantation system 100 further includes wafer chuck 118 within processing chamber 130, which is configured to position wafer 116 in the path of ribbon beam 105, thereby causing implantation of ions into wafer 116.

Ion implantation system 100 further includes controller 132 which includes memory 134 (which optionally includes one or more computer-readable storage mediums), processor(s) 136, and input/output (I/O) interface 138. Controller 132 is configured to control the various other components of ion implantation system 100.

Ion source 102 further includes faceplate 128 on one side of arc chamber 124. Faceplate 128 includes exit aperture 126 (e.g., arc slit) through which ions extracted from ion source 102 exit arc chamber 124. For example, exit aperture 126 can be a slit or a slot configured to form the ribbon shape of ribbon beam 105. In some examples, faceplate 128 is coupled to a power source to bias faceplate 128, thereby creating a potential difference (e.g., extraction voltage) between ion source 102 and extraction manipulator 104 to generate ribbon beam 105.

Ribbon beam 105 is comprised of multiple individual beamlets which are arranged in a line as ribbon beam 105 exits ion source 102. Ribbon beam 105 may include any number of individual beamlets as needed to deliver the charged ions from ion source 102 to wafer 116. Thus, ribbon beam 105 may include 2, 3, 4, 5, 10, 15 or more beamlets depending on the configuration of faceplate 128 and exit aperture 126. The angle between each pair of adjacent beamlets is a ribbon beam angle of ribbon beam 105. Accordingly, ribbon beam 105 has n−1 ribbon beam angles when n is the number of beamlets that make up ribbon beam 105.

As ribbon beam 105 travels through ion implantation system 100 and is delivered to wafer 116 the ribbon beam angles of ribbon beam 105 may need to be corrected to ensure that the all of the beamlets hit wafer 116 and thus implant the required ions. However, the conventional systems and processes for generating ribbon beam 105 may not include provisions for correcting the ribbon beam angles. Accordingly, as described further below, ion implantation system 100 includes one or more dipole or quadrupole magnets in various locations along the path of ribbon beam 105 to flexibly and reliably way to correct the ribbon beam angles of ribbon beam 105.

Extraction manipulator 104 includes suppression electrode 120 and ground electrode 122. Suppression electrode 120 is configured to resist electrons from back-flowing into ion source 102 and ground electrode 122 is coupled to a ground potential. This configuration causes extraction manipulator 104 to generate a ribbon beam by extracting ions from ion source 102.

As shown in FIG. 1, ribbon beam 105 is directed along a linear trajectory from extraction manipulator 104 to magnetic analyzer 108. Magnetic analyzer 108 includes yoke 107 and electromagnetic coils 109 wrapped around opposite sidewalls of yoke 107. Yoke 107 defines a channel which ribbon beam 105 travels through magnetic analyzer 108. As shown, ribbon beam 105 enters magnetic analyzer 108 through first opening 111 of yoke 107 and exits magnetic analyzer 108 through second opening 113 of yoke 107. Magnetic analyzer 108 is configured to generate a magnetic field that causes ribbon beam 105 to deflect in a particular direction (e.g., the x-direction). While being deflected, the ions in ribbon beam 105 are filtered according to energy and mass-to-charge ratio such that only ions having a desired energy and mass-to-charge ratio may pass through magnetic analyzer 108 toward wafer 116. In some examples, magnetic analyzer 108 directs ribbon beam 105 along a linear path from opening 113 to electrode assembly 106.

As shown in FIG. 1, ribbon beam 105 is directed through variable aperture assembly 112 and multipole magnets 110 between magnetic analyzer 108 and electrode assembly 106. Variable aperture assembly 112 includes two or more movable plates that define variable aperture 115. The movable plates are configured to adjust the size and shape of the variable aperture 115, which defines the size and shape of ribbon beam 105 exiting variable aperture assembly 112. Further, in some examples, variable aperture assembly 112 adjusts the ion current of ribbon beam 105 by adjusting the size of variable aperture 115.

Multipole magnets 110 are magnets that include an array of coils with more than four coils and thus multiple poles (e.g., at least two poles for each coil) arranged on ferromagnetic supports. Electrical energy is supplied to the array of coils to generate magnetic fields for each coil of the array of coils to create several different magnetic forces that act on ribbon beam 105 in different directions. Thus, the magnetic fields generated by the array of coils may adjust the size, shape, angle, and/or uniformity of ribbon beam 105 at the same time. For example, a suitable magnetic field can be generated by multipole magnets 110 to control the size, current density, and shape of the ribbon beam 105 simultaneously.

Electrode assembly 106 is configured to accelerate and/or decelerate an ribbon beam to control the energy of the ribbon beam. In particular, electrode assembly 106 includes multiple electrodes for manipulating the ribbon beam as the ribbon beam travels through electrode assembly 106. The ribbon beam can thus enter opening 117 at an initial energy and exit opening 119 at a final energy different from the initial energy. In some examples, as discussed further below, dipole magnets 140 may be placed within electrode assembly 106, as shown in FIG. 1. Dipole magnets 140 can be placed within electrode assembly 106 before the bend of ribbon beam 105 or after the bend of ribbon beam 105. Accordingly, dipole magnets 140 interact with ribbon beam 105 before the acceleration or deceleration of ribbon beam 105 by electrode assembly 106 or after the acceleration or deceleration of ribbon beam 105 by electrode assembly 106.

As shown in FIG. 1, ribbon beam 105 exits opening 119 of electrode assembly 106 and is directed through multipole magnets 114. In some examples, multipole magnets 114 are the same as multipole magnets 110 described above and thus are configured to adjust the shape, direction, focus, and/or uniformity of ribbon beam 105. Further, in some examples, multipole magnets 114 are configured to steer ribbon beam 105 to strike the surface of wafer 116 in a particular location or to allow for other positional adjustments of ribbon beam 105. In other examples, multipole magnets 114 may be configured to repeatedly deflect ribbon beam 105 to scan wafer 116, which may be stationary or moving.

Wafer chuck 118 is configured to position wafer 116 in front of ribbon beam 105 exiting multiple magnets 114 to cause ions to implant into wafer 116. In some examples, wafer chuck 118 is configured to translate in one or more directions. For example, wafer chuck 118 can be configured to move wafer 116 with respect to ribbon beam 105 to scan ribbon beam 105 across wafer 116. In some examples, wafer chuck 118 is configured to rotate wafer 116.

It should be recognized that wafer 116 may comprise any suitable substrate used in the manufacturing of semiconductor devices, solar panels, or flat-panel displays. In examples where wafer 116 comprises a semiconductor substrate (e.g., silicon, germanium, gallium arsenide, etc.), wafer 116 may include semiconductor devices at least partially formed thereon.

As shown in FIG. 1, ion implantation system 100 further includes one or more dipole magnets 140 at various locations along the path of ribbon beam 105. Dipole magnets 140 are configured to adjust one or more ribbon beam angles of ribbon beam 105. As ribbon beam 105 travels through the various components of ion implantation system 100 as described herein, individual beamlets of ribbon beam 105 may drift (e.g., due to magnetic fields created by some of the components) causing one or more of the ribbon beam angles of ribbon beam 105 to change. Accordingly, ribbon beam angles of ribbon beam 105 may be corrected at various points in ion implantation system 100 as described below. Additionally, in some examples, the ribbon beam angles of ribbon beam 105 may be adjusted to prior to entering or after exiting one of the other components of ion implantation system 100 so that ribbon beam angle 105 is correctly manipulated by the component.

Figure 2:
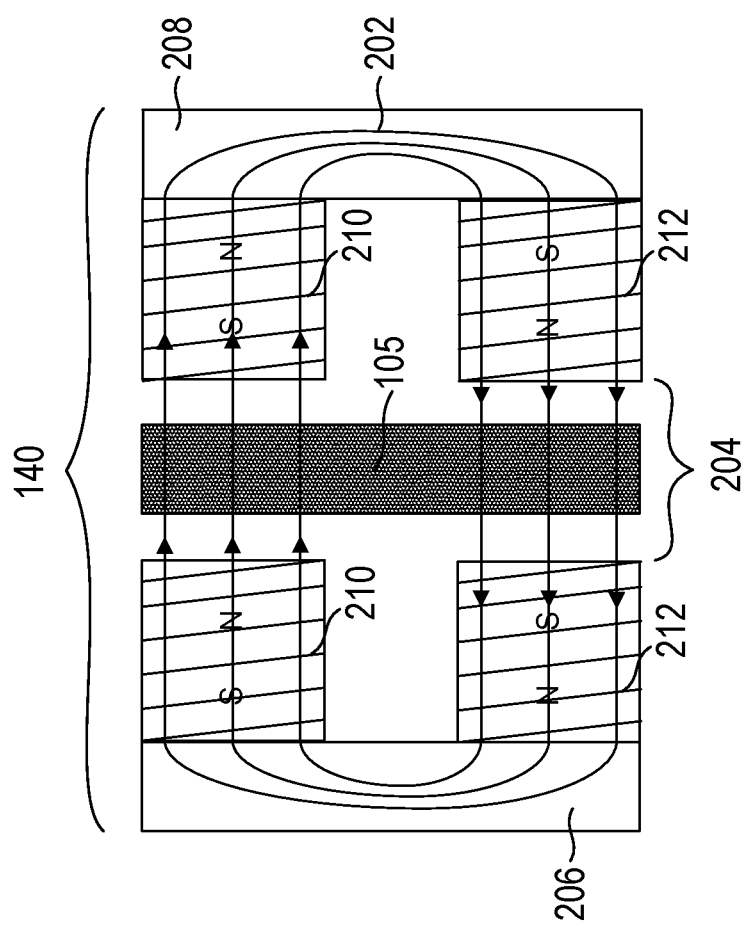
FIG. 2 illustrates a two-dimensional, side perspective view of a dipole magnet and the corresponding ribbon beam, according to various examples.

As shown in FIG. 2, dipole magnets 140 create a single magnetic field 202 to influence one or more of the ribbon beam angles of ribbon beam 105 with a single magnetic force. In particular, dipole magnets 140 include a single coil or a single broken coil (e.g., a coil with two halves) that create magnetic field 202. Accordingly, dipole magnets 140 create a magnetic force that affects the individual beamlets of ribbon beam 105 in a single direction. This allows for fine adjustments to be made in a specific direction to adjust or correct the ribbon beam angles of ribbon beam 105 without affecting other characteristics of ribbon beam 105 like overall shape or direction. In this way, dipole magnets 140 allow for corrections to ribbon beam 105 that would be otherwise difficult to perform with conventional multipole magnets like multipole magnets 110 and 114 of ion implantation system 100.

The strength of magnetic field 202 is based on the size of gap 204 between the two halves of the dipole magnet 206 and 208 and the currents 210 and 212 applied to the dipole magnet. In particular, the strength of magnetic field 202 is inversely proportional to the size of gap 204 between half 206 and half 208 of dipole magnet 140. Accordingly, the strength of magnetic field 202 may be increased by decreasing the size of gap 204. Similarly, the strength of magnetic field 202 may be decreased by increasing the size of gap 204. Thus, in some examples, the size of gap 204 is a tunable gap that may be adjusted to increase or decrease the strength of magnetic field 202.

In some examples, the size of gap 204 is a predetermined size. Accordingly, the size of gap 204 may be predetermined and preset for a specific strength of magnetic field 202. For example, if a specific type of correction to one or more angles of ribbon beam 105 is known then the size of gap 204 is predetermined to provide that type of correction to the one or more angles of ribbon beam 105 (e.g., convergent, divergent, or keeping the angles the same).

The strength of magnetic field 202 created by dipole magnet 140 is also directly proportional to the currents 210 and 212 applied to dipole magnet 140. Thus, the strength of magnetic field 202 may be increased by increasing the currents 210 and 212 and the strength of magnetic field 202 may be decreased by decreasing the current 210 and 212. When both currents 210 and 212 are increased or decreased equally the strength of magnetic field 202 is adjusted symmetrically, so that the strength of magnetic field 202 remains consistent. However, in some examples, currents 210 and 212 may be adjusted differently (e.g., current 210 is increased and current 212 is not) in order to adjust the strength of magnetic field 202 asymmetrically. For example, when current 210 is increased and current 212 is not, the strength of the top half of magnetic field 202 will increase while the strength of the bottom half of the magnetic field 202 will stay the same. In this way the magnetic field 202 may be adjusted based on the composition of ribbon beam 105 so that dipole magnet 140 adjusts one or more ribbon beam angles of ribbon beam 105 correctly.

In particular, the strength of magnetic field 202 should be higher when the energy of the ribbon beam 105 is higher and/or ribbon beam 105 is comprised of heavier ions. Conversely, the strength of the magnetic field 202 should be lower when the energy of ribbon beam 105 is lower and/or ribbon beam 105 is comprised of lighter ions. Further, in some cases the energy of ribbon beam 105 and/or the distribution of ions in ribbon beam 105 is not uniform across ribbon beam 105. Thus, the strength of magnetic field 202 is adjusted to match the varying energies and/or distributions of ions by adjusting currents 210 and 212 asymmetrically as discussed above.

In addition to the size of gap 204 and the currents 210 and 212, the polarity of dipole magnets 140 are be selected to adjust the one or more ribbon beam angles of ribbon beam 105 in a specific manner. Moreover, specific types of dipole magnets may be selected depending on whether a portion of ribbon beam 105 or the entirety of ribbon beam 105 must be affected by magnetic field 202.

Figure 3:
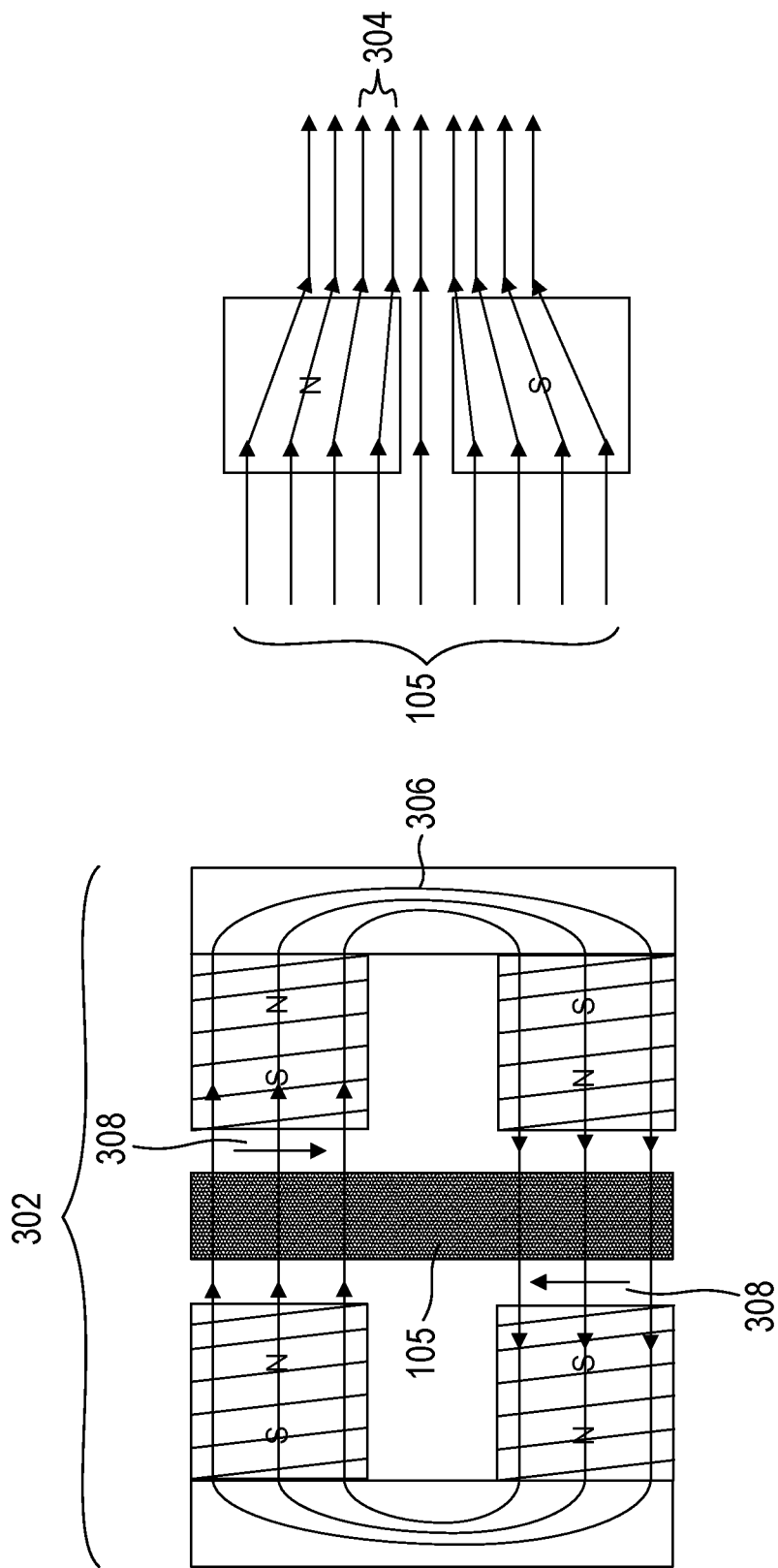
FIG. 3 illustrates a two-dimensional, side perspective view of a dipole magnet and the corresponding ribbon beam, according to various examples.

In some examples, as shown in FIG. 3, one or more of dipole magnets 140 is a dipole magnet 302 configured to decrease one or more ribbon beam angles 304 of ribbon beam 105. In particular, dipole magnet 302 is configured to create magnetic field 306 which travels clockwise around ribbon beam 105 and exerts force 308 on ribbon beam 105 causing the beamlets of ribbon beam 105 to move closer together towards the middle of magnetic field 306. For example, as shown in FIG. 3, dipole magnet 302 is configured such that a first portion of dipole magnet 302 has a south pole on the top portion of ribbon beam 105 and a north pole on the bottom portion of ribbon beam 105 on the right side of ribbon beam 105. Similarly, a second portion of dipole magnet 302 has a north pole on the top portion of ribbon beam 105 and a south pole on the bottom portion of ribbon beam 105 on the left side of ribbon beam 105.

This configuration of dipole magnet 302 creates force 308 which acts on ribbon beam 105 to decrease the ribbon beam angles 304 of ribbon beam 105. Specifically, as force 308 causes the beamlets of ribbon beam 105 to move closer together, each of ribbon beam angles 304 between the individual beamlets is decreased. Thus, the beamlets of ribbon beam 105 are closer together after passing through dipole magnet 302.

In some examples, dipole magnet 302 is selected for use in ion implantation system 100 at locations after ribbon beam 105 exits a component of ion implantation system 100. In particular, dipole magnet 302 may be used after ribbon beam 105 exits magnetic analyzer 108. Using dipole magnet 302 to decrease the ribbon beam angles 304 of ribbon beam 105 after exiting magnetic analyzer 108 can decrease the spread of ribbon beam 105 and thus reduce the possibility of one or more beamlets of ribbon beam 105 contacting an unwanted portion of ion implantation system 100. Further, by decreasing the ribbon beam angles and thus reducing the spread in this manner, dipole magnet 302 is configured so that ribbon beam 105 may travel to the next component of ion implantation system 100 (e.g., variable aperture assembly 112) correctly. Similarly, dipole magnet 302 could also be selected and implemented in various other locations of ion implantation system 100 including those shown in FIG. 1 and others to correct the spread of ribbon beam 105 so that ribbon beam 105 can successfully travel through ion implantation system 100.

Figure 4:
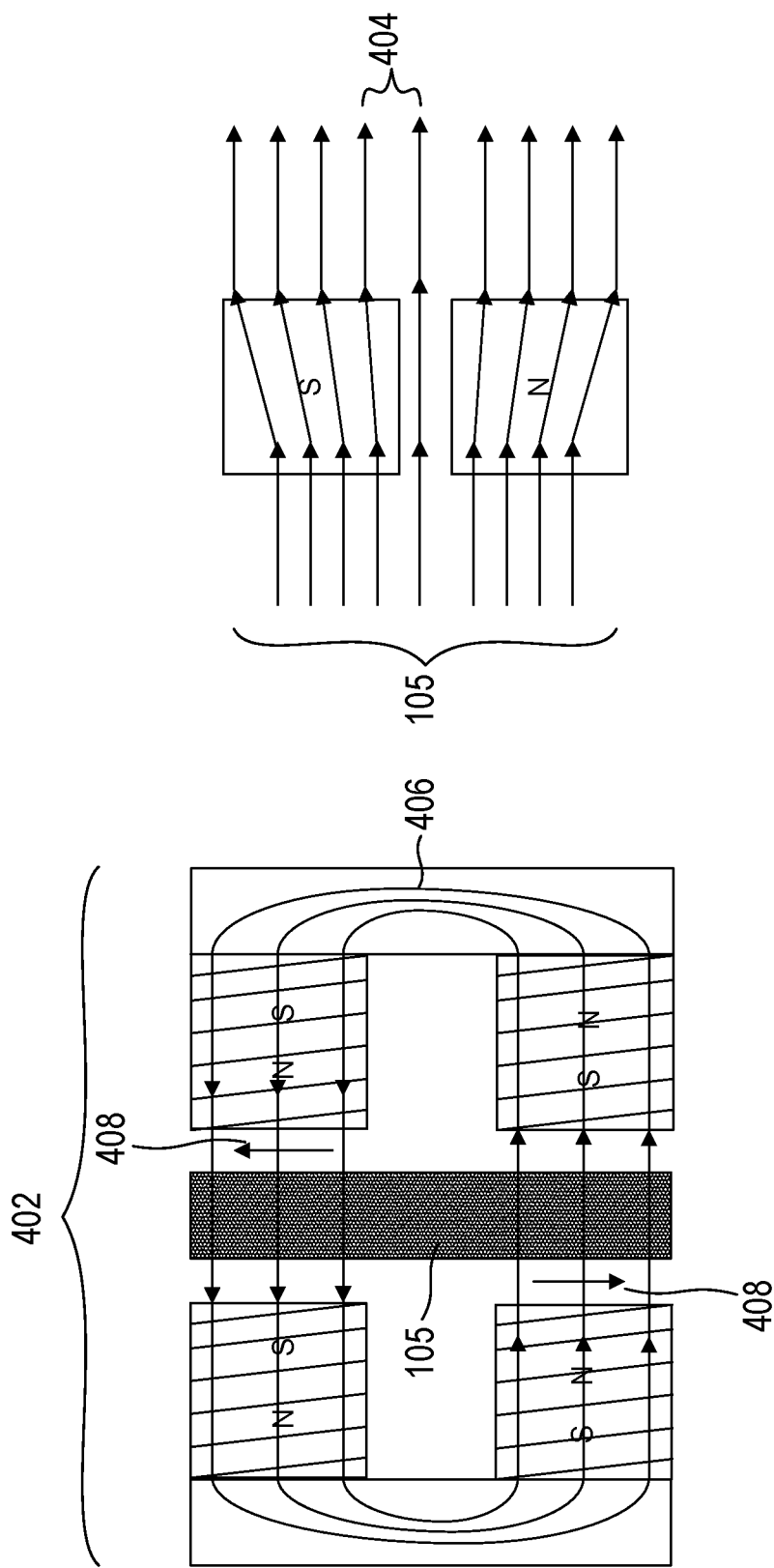
FIG. 4 illustrates a two-dimensional, side perspective view of a dipole magnet and the corresponding ribbon beam, according to various examples.

In some examples, as shown in FIG. 4, one or more of dipole magnets 140 is a dipole magnet 402 configured to increase one or more ribbon beam angles 404 of ribbon beam 105. In particular, dipole magnet 402 is configured to create magnetic field 406 which travels counter clockwise around ribbon beam 105 and exerts force 408 on ribbon beam 105 causing the beamlets of ribbon beam 105 to move away from the center of magnetic field 406 and thus get farther apart. For example, as shown in FIG. 4, dipole magnet 402 is configured such that a first portion of dipole magnet 402 has a north pole on the top portion of ribbon beam 105 and a south pole on the bottom portion of ribbon beam 105 on the right side of ribbon beam 105. Similarly, a second portion of dipole magnet 402 has a south pole on the top portion of ribbon beam 105 and a north pole on the bottom portion of ribbon beam 105 on the left side of ribbon beam 105.

This configuration of dipole magnet 402 creates force 408 which acts on ribbon beam 105 to increase the ribbon beam angles 404 of ribbon beam 105. Specifically, as force 408 causes the beamlets of ribbon beam 105 to move farther apart, each of ribbon beam angles 404 between the individual beamlets is increased. Thus, the beamlets of ribbon beam 105 are farther apart after passing through dipole magnet 402.

In some examples, dipole magnet 402 is selected for use in ion implantation system 100 at locations before ribbon beam 105 enters a component of ion implantation system 100. In particular, dipole magnet 402 may be used after ribbon beam 105 exits ion source 102 and before ribbon beam 105 enters magnetic analyzer 108. Using dipole magnet 402 to increase the ribbon beam angles 404 of ribbon beam 105 before entering magnetic analyzer 108 can increase the spread of ribbon beam 105 and ensure that each of the beamlets of ribbon beam 105 is correctly influenced by magnetic analyzer 108. Further, by using dipole magnet 402 just before ribbon beam 105 enters a component of ion implantation system 100, ribbon beam 105 travel from component to component with the reduced spread discussed above. This reduces the chances of ribbon beam 105 contacting unwanted components of ion implantation system 100 while traveling between components and allows for the maximum exposure of the beamlets of ribbon beam 105 within the components. Dipole magnet 302 could also be selected and implemented in various other locations of ion implantation system 100 including those shown in FIG. 1 and others to correct the spread of ribbon beam 105 so that ribbon beam 105 can successfully travel through ion implantation system 100.

Figure 5:
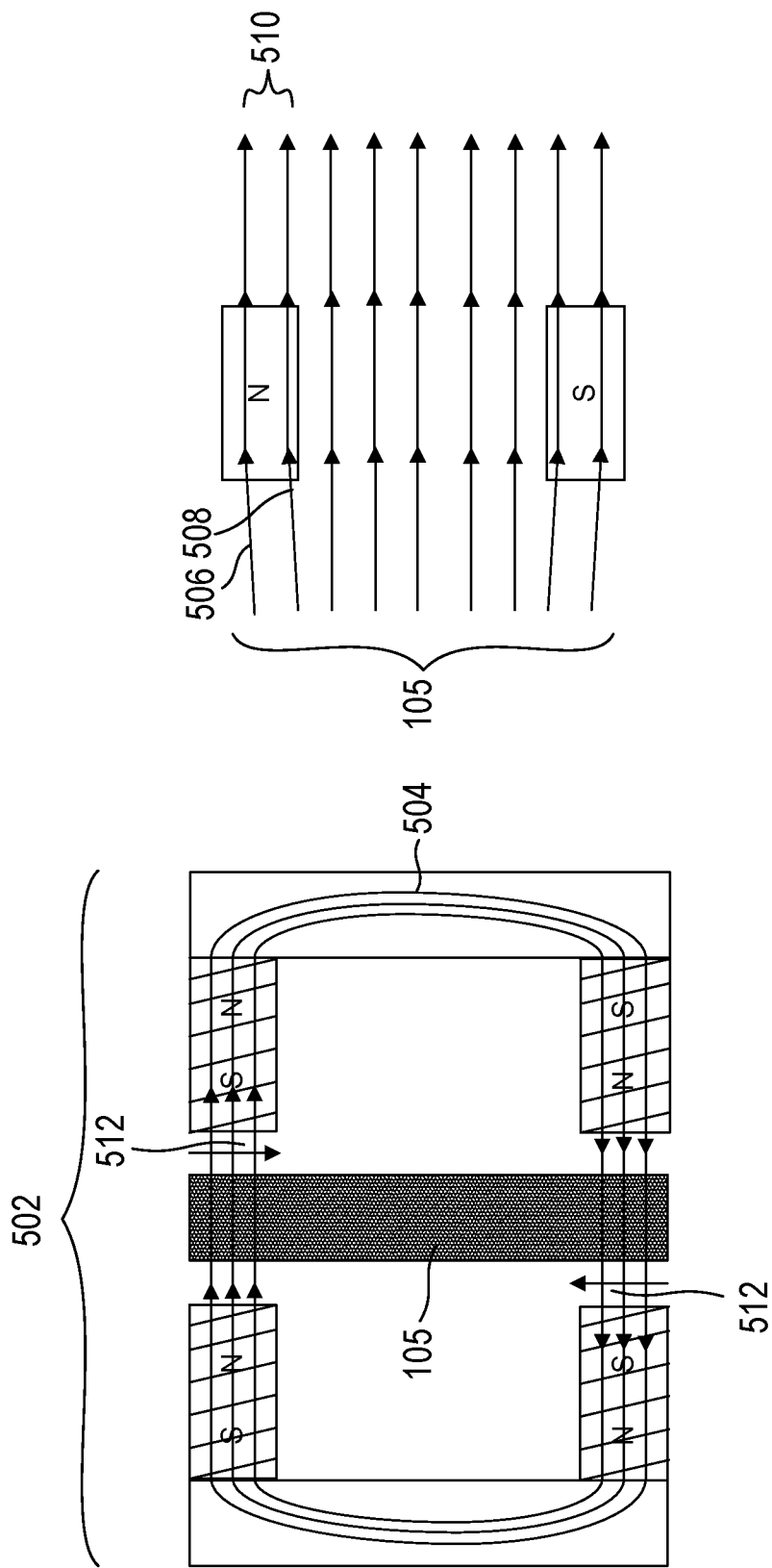
FIG. 5 illustrates a two-dimensional, side perspective view of a dipole magnet and the corresponding ribbon beam, according to various examples.

In some examples, as shown in FIG. 5 one or more of dipole magnets 140 is a dipole magnet 502 configured to adjust a first beamlet 506 and a second beamlet 508 to be substantially parallel. Put another way, dipole magnet 502 is configured to adjust ribbon beam angle 510 to zero so that first beamlet 506 and second beamlet 508 are parallel. In particular, dipole magnet 502 is configured to create magnetic field 504 which exerts force 512 on ribbon beam 105. Force 512 causes beamlets 506 and 508 to move towards the center of magnetic field 504 until they are parallel to each other and the other beamlets of ribbon beam 105.

In some examples, dipole magnet 502 is selected for use in ion implantation system 100 at locations where the uniformity of ribbon beam 105 is important. For example, dipole magnet 502 may be placed before ribbon beam 105 enters processing chamber 130 and interacts with wafer 116, prior to multipole magnet 114, before electrode assembly 106, or within (e.g., in the middle of) electrode assembly 106. In these locations of ion implantation system 100 it may be important for the individual beamlets of ribbon beam 105 to be traveling in parallel or substantially parallel paths to interact with the components of ion implantation system 100. In particular, when ribbon beam 105 impacts wafer 116 ensuring that the beamlets of ribbon beam 105 are parallel can increase the coverage of ion implantation by ribbon beam 105 on wafer 116. It will be recognized that by causing the beamlets of ribbon beam 105 to be parallel at a location earlier in ion implantation system 100 may be advantageous because the parallelism of the beamlets carries through ion implantation system 100 as ribbon beam 105 traverses the various components.

In addition to configuring dipole magnets 140 to create a specific type of magnetic field and force to influence the beamlets to increase or decrease the ribbon beam angles of ribbon beam 105, the size of dipole magnets 140 may also be selected based on which portions of ribbon beam 105 (e.g., which beamlets of ribbon beam 105) should be affected. As described in more detail below, dipole magnets 140 may be short type dipole magnets when a specific or localized portion of ribbon beam 105 should be affected, while dipole magnets 140 may be long type dipole magnets when all of ribbon beam 105 should be affected. In this way dipole magnets 140 may be tailored to influence all beamlets of ribbon beam 105 or a subset of the beamlets of ribbon beam 105.

In some examples, as shown in FIG. 5, one or more of dipole magnets 140 is a short type dipole magnet 502. Short type dipole magnets create a localized magnetic field 504 that is configured to adjust beamlets 506 and 508 in a small portion of ribbon beam 105. In order to create the localized magnetic field, the dipole magnet is configured to have a short amount of the legs of the magnet aligned with ribbon beam 105. Accordingly, only the portion of ion beam 105 that is aligned with the legs of the dipole magnet is affected by magnetic field 504, as shown in FIG. 5.

Short type dipole magnets like those depicted in FIG. 5 are selected when a portion of ribbon beam 105 has a ribbon beam angle that needs to be corrected. For example, beamlets 506 and 508 are on paths leading away from the rest of ribbon beam 105. These paths will likely cause beamlets 506 and 508 to interact with a portion of ion implantation system 100 or one or the components of ion implantation system 100 in an undesirable manner. Accordingly, short type dipole magnet 502 is selected to apply magnetic field 504 specifically to beamlets 506 and 508 and correct ribbon beam angle 510 by bring ribbon beam angle 510 to zero. This causes beamlets 506 and 508 to become parallel to each other and the other beamlets of ribbon beam 105.

As another example, two beamlets (not pictured) may be on paths leading towards the center of ribbon beam 105. These paths may cause the beamlets to interact with other beamlets of ribbon beam 105 causing contamination of the beamlets and ribbon beam 105 to incorrectly implant ions into a wafer. Thus, a short type dipole magnet may be selected to apply a magnetic field specifically to the beamlets and correct the ribbon beam angle between them to zero. This will cause the beamlets to become parallel to each other and the other beamlets of ribbon beam 105 so that ribbon beam 105 is provided correctly through ion implantation system 100 to the wafer.

Figure 6:
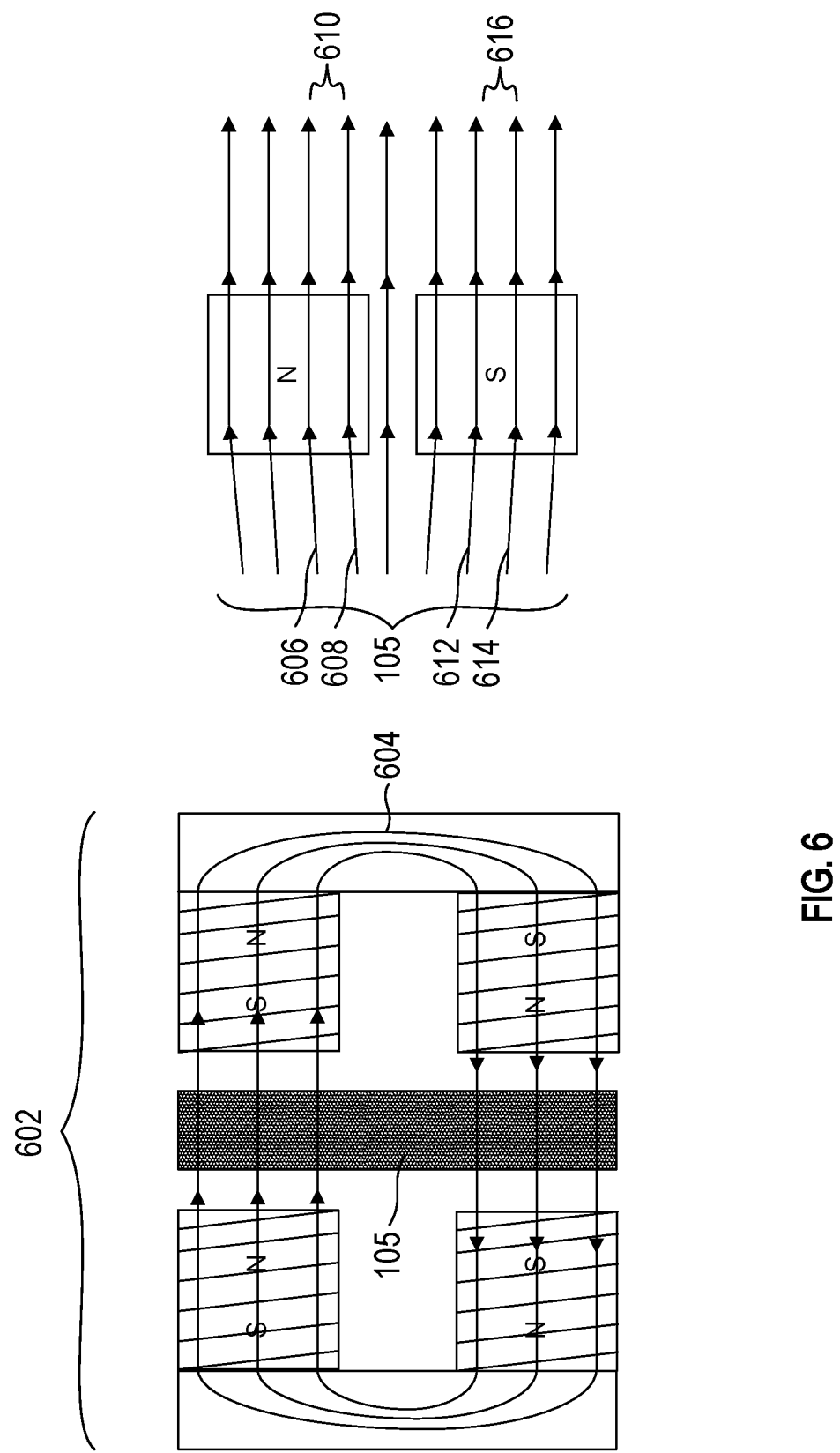
FIG. 6 illustrates a two-dimensional, side perspective view of a dipole magnet and the corresponding ribbon beam, according to various examples.

In some examples, as shown in FIG. 6, one or more of dipole magnets 140 is a long type dipole magnet 602. Long type dipole magnets create a magnetic field 604 that is configured to adjust a majority of the beamlets of ribbon beam 105. In particular, long type dipole magnet 602 is configured to adjust beamlets 606, 608, 612, and 614 and ribbon beam angles 610 and 616. In order to adjust all of beamlets 606, 608, 612, and 614 and ribbon beam angles 610 and 616 long type dipole magnet 602 has long legs that align with each of the specified beamlets and more in ribbon beam 105. Accordingly, most or all of ribbon beam 105 is affected by magnetic field 604 because the long legs of dipole magnet 602 align with most of the beamlets in ribbon beam 105.

Long type dipole magnets like those depicted in FIG. 6 are selected when most or all of ribbon beam 105 has ribbon beam angles that need to be corrected. For example, beamlets 606, 608, 612, and 614 are all on expanding paths from the center of ribbon beam 105. If unchecked these paths will cause beamlets 606, 608, 612, and 614 to miss the desired waiver and/or hit undesirable portions or components of ion implantation system 100. Accordingly, long type dipole magnet 602 is selected to apply magnetic field 604 to the majority of ribbon beam 105 including beamlets 606, 608, 612, and 614. Magnetic field 604 adjusts ribbon beam angles 610 and 616 to zero causing beamlets 606, 608, 612, and 614 to be substantially parallel.

As another example, several beamlets may be on paths leading towards the center of ribbon beam 105. These paths may cause the beamlets to hit each other and interfere with the delivery of ribbon beam 105 to the wafer. Accordingly, a long type dipole magnet may be selected to apply a magnetic field to all of the beamlets and correct the ribbon beam angles between them to zero. This will result in the beamlets of ribbon beam 105 being substantially parallel to each other so that they may be delivered to the wafer. In this way the ribbon beam angles between the beamlets of ribbon beam 105 may be corrected as desired to ensure that ribbon beam 105 implants the wafer correctly.

Selection of a short type or long type dipole magnet may be based on the amount of correction needed for the ribbon beam angle, other magnetic fields affecting ribbon beam 105, the beamlets of ribbon beam 105 expected to be affected, the position of the dipole magnet in ion implantation system 100, the energy of ribbon beam 105, the mass of ribbon beam 105, and the type of ion used in ribbon beam 105.

Figure 7:
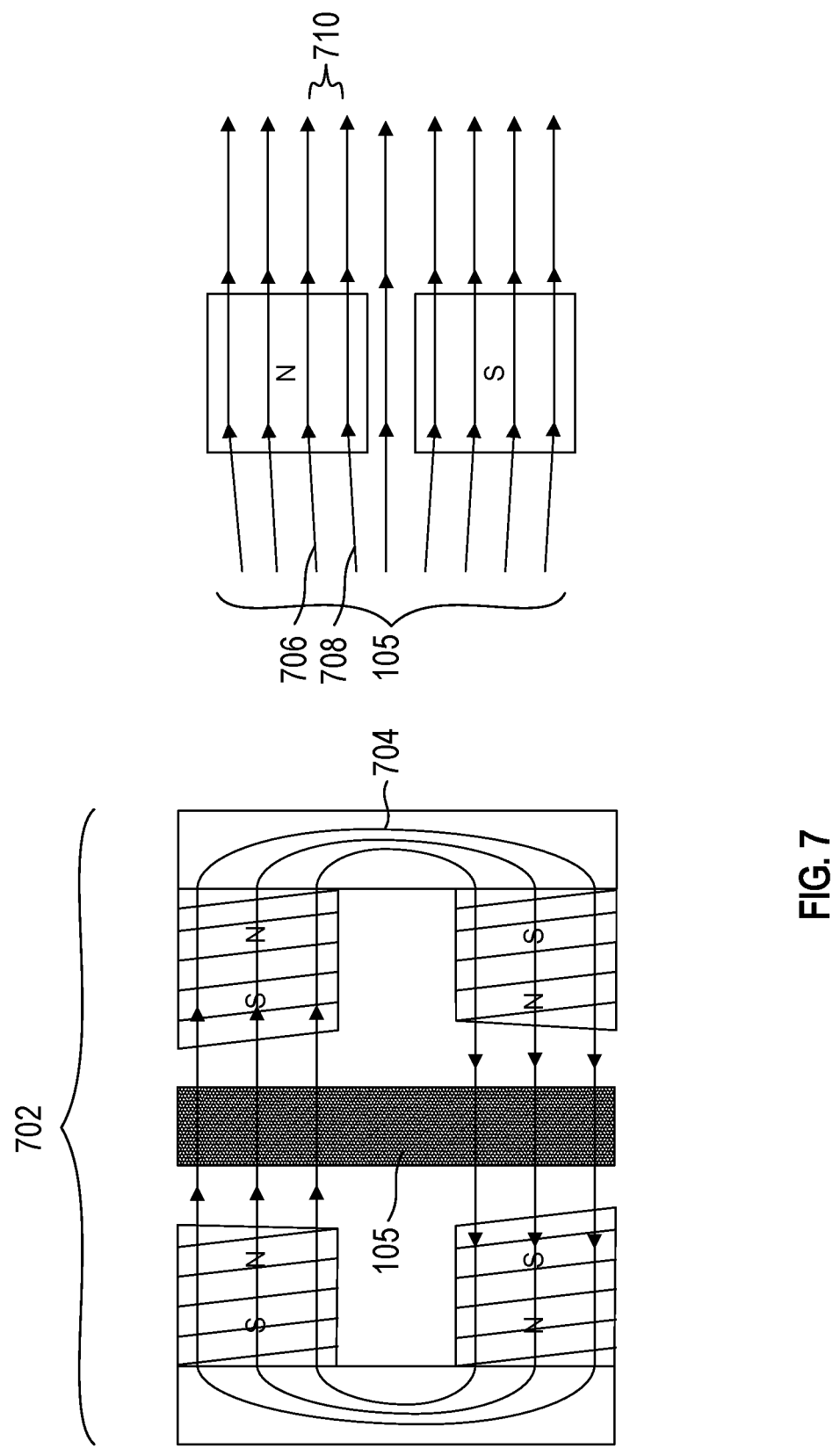
FIG. 7 illustrates a two-dimensional, side perspective view of a dipole magnet and the corresponding ribbon beam, according to various examples.

In some examples, as shown in FIG. 7, one or more of dipole magnets 140 is a wedge-shaped dipole magnet 702. In some examples, using a dipole magnet as depicted in FIG. 5 or 6 may result in beamlets that are substantially parallel. Because the beamlets are substantially parallel, the ribbon beam angles between the beamlets may not be zero and thus may still cause the beamlets to have slightly convergent or divergent paths. In some examples, this may not be desirable because the paths may cause the beamlets to eventually collide with each other or components of ion implantation system 100.

In these examples a wedge-shaped dipole magnet like the one depicted in FIG. 7 may be selected for use in ion implantation system 100. Wedge-shaped dipole magnet 702 is configured to create asymmetrical magnetic field 704 that interacts with beamlets 706 and 708 to correct ribbon beam angle 710 to be zero or close to zero. This causes beamlets 706 and 708 to be parallel and thus travel the desired path. Wedge-shaped dipole magnet 702 is configured to create asymmetrical magnetic field 704 by having outside edges of its legs longer than the inside edges of its legs. This results in a wedge-shape along the edge of each half of the dipole magnet that causes the force created by magnetic field 704 to be stronger at the edges of dipole magnet 702 and weaker at the center of dipole magnet 702. This will cause larger corrections on beamlet 706 and other beamlets on the edges of ribbon beam 105 and smaller corrections on beamlet 708 and other beamlets near the center of ribbon beam 105.

Wedge-shaped dipole magnets may be long type dipole magnets as shown in FIG. 7 or short type dipole magnets in various examples. Selection of the wedge-shape may include similar considerations as selection of a short type or long type dipole magnet including the amount of correction needed for the ribbon beam angle, other magnetic fields affecting ribbon beam 105, the beamlets of ribbon beam 105 expected to be affected, the position of the dipole magnet in ion implantation system 100, the energy of ribbon beam 105, the mass of ribbon beam 105, and the type of ion used in ribbon beam 105.

Figure 8:
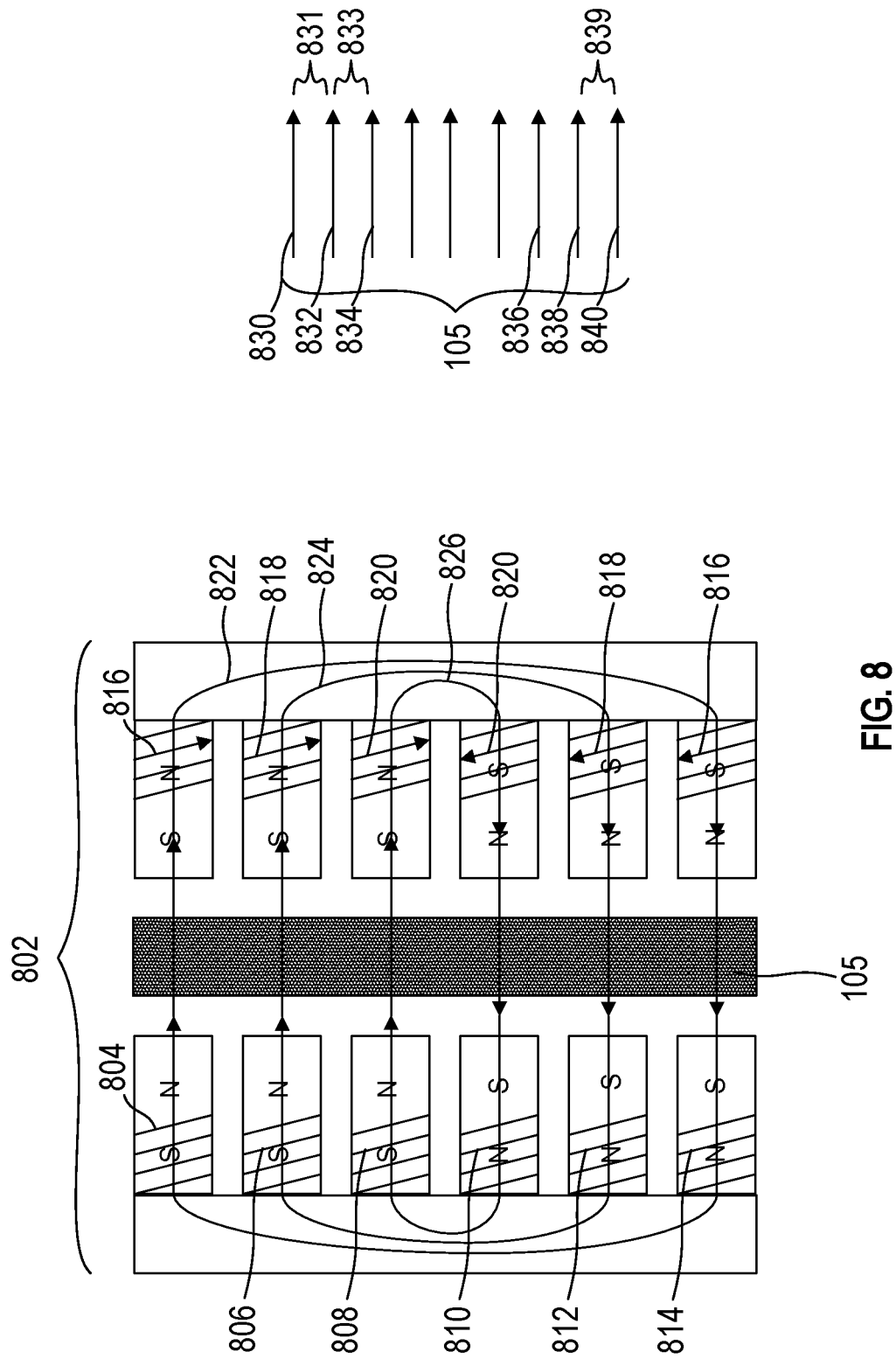
FIG. 8 illustrates a two-dimensional, side perspective view of a dipole magnet and the corresponding ribbon beam, according to various examples.

In some examples, as shown in FIG. 8, one or more of dipole magnets 140 has multiple coils with individual adjustable coil currents like dipole magnet 802. Dipole magnet 802 works in a substantially similar manner to the various dipole magnets discussed above with reference to FIGS. 2-7. However, because dipole magnet 802 has multiple coils and each coil has an individual adjustable coil current, dipole magnet 802 may create various magnetic fields that each interact with distinct beamlets of ribbon beam 105 to make corrections to various beam angles of ribbon beam 105.

In particular dipole magnet 802 includes coils 804, 806, 808, 810, 812, and 814. Each of coils 804, 806, 808, has an associated coil current 816, 818, and 820, with the paired coils 810, 812, and 814 having the same associated coil current in the opposite polarity. Accordingly, a first magnetic field 822 is created by coils 804 and 814 based on coil current 816, a second magnetic field 824 is created by coils 806 and 812 based on coil current 818, and a third magnetic field 826 is created by coils 808 and 810 based on coil current 820. Each of magnetic fields 822, 824, and 826 can be changed independently by varying coil currents 816, 818, and 820, respectively.

Additionally, each of magnetic fields 822, 824, and 826 affect the beamlets of ribbon beam 105 causing the beamlets to move closer together (e.g., converge), farther apart (e.g., diverge), or stay substantially parallel based on the strengths of magnetic fields 822, 824, and 826 and coil currents 816, 818, and 820. However, because each of magnetic fields 822, 824, and 826 cover different areas of ribbon beam 105, adjustments to individual beamlets and beam angles can be achieved with greater precision than when one magnetic field is applied to the entirety of ribbon beam 105. In this way, some beamlets of ribbon beam 105 may be influenced by one of the magnetic fields to converge, while other beamlets of ribbon beam 105 may be influenced by a different magnetic field to diverge.

For example, when coil current 816 and coil current 818 are equal coils 804 and 806 create magnetic fields 822 and 824 with substantially similar strengths and forces that act in the same direction, keeping beamlet 830 and beamlet 832 substantially parallel. At the same time, coil current 820 is substantially higher than coil current 818, creating a stronger magnetic field which causes beamlet 834 to converge towards beamlet 832, reducing beam angle 833.

As another example, when coil current 816 is higher than coil current 818 and coil current 818 is higher than coil current 820, magnetic fields 822, 824, and 826 each act to push beamlets 830, 832, and 834 towards the center of ribbon beam 105. This has the effect of reducing beam angles 831 and 833 and correcting a divergence of beamlets 830, 832, and 834.

As another example, when coil current 816 is lower than coil current 818, magnetic fields 822 and 824 interact to cause beamlet 840 to diverge and move away from the center of ribbon beam 105. Accordingly, beam angle 839 between beamlets 838 and 840 increases. At the same time, coil current 818 and coil current 820 are the same, causing magnetic fields 824 and 826 to interact and cause beamlets 836 and 838 to remain substantially parallel.

Accordingly, in some examples, dipole magnet 140 includes at least two coils and a first current is applied to a first coil of the at least two coils and a second current is applied to a second coil of the at least two coils. In some examples, the first current and the second current are equal. In some examples, the first current is greater than the second current. In some examples, the second current is greater than the first current.

In some examples, dipole magnet 140 includes three coils, four coils, five coils, six coils, seven coils, etc. Accordingly, dipole magnet 140 can include any number of coils, each of the coils having a respective current applied to it. Thus, in some examples, a third current, a fourth current, a fifth current, etc. are applied to the various coils of dipole magnet 140 to create several different magnetic fields which each interact with beamlets of ribbon beam 105.

It will further be recognized that the strength coil currents 816, 818, and 820 and accordingly magnetic fields 822, 824, and 826 can be used in any combination including the examples discussed above and other combinations that were not discussed. In this way, any combination of converging, diverging, and maintain beam angles of beamlets of ribbon beam 105 may be achieved by combining different magnitudes and polarities of magnetic fields 822, 824, and 826.

Figure 9:
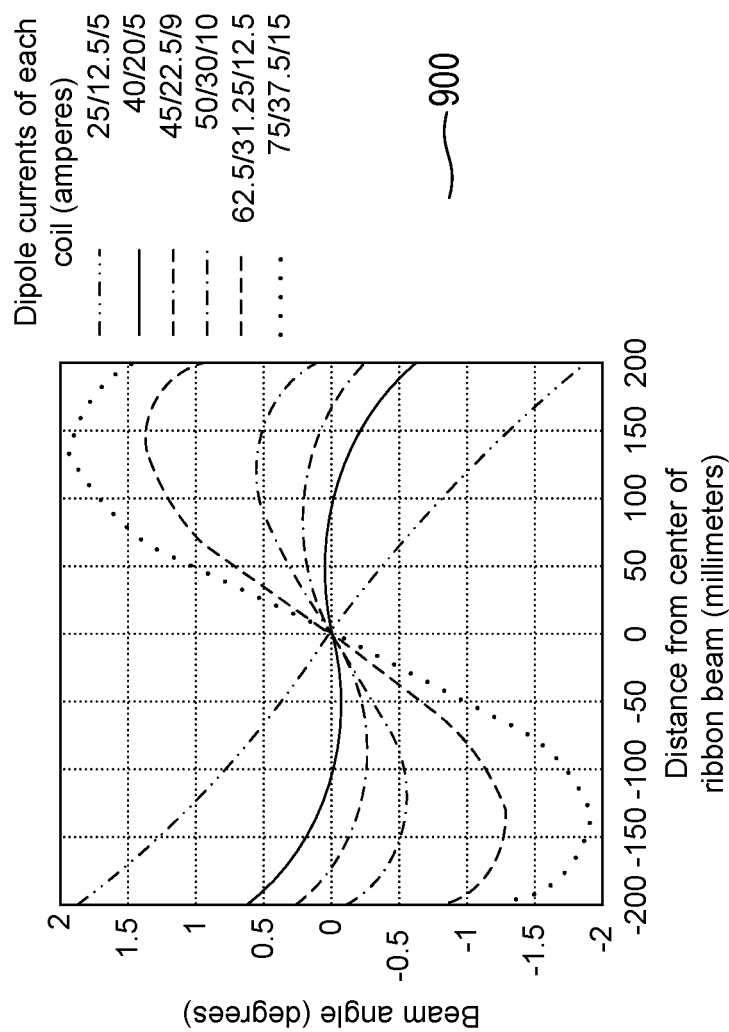
FIG. 9 illustrates a graph of the effect current has on a beam angle of a ribbon beam based on the distance between the beam angle and the center of the ribbon beam, according to various examples.

FIG. 9 illustrates graph 900 of the effect the current has on a beam angle of ribbon beam 105 based on the distance between the beam angle and the center of ribbon beam 105. In particular, FIG. 9 illustrates that as coil currents 816, 818, and 820 are adjusted they will have different effects on beam angles located far away from the center of ribbon beam 105.

For example, when coil current 816 is 25 A, coil current 818 is 12.5 A and coil current 820 is 5 A, the magnetic fields 822, 824, and 826, have a large effect on the beam angle far away from the center of ribbon beam 105, causing the beam angles to become less divergent. As another example, when coil current 816 is 75 A, coil current 818 is 37.5 A, and coil current 820 is 15 A, the magnetic fields 822, 824, and 826, also have a large effect on the beam angle far away from the center of ribbon beam 105 causing the beam angle to become more convergent.

As another example, when coil current 816 is 45 A, coil current 818 is 22.5 A, and coil current 820 is 9 A, the magnetic fields 822, 824, and 826, have a relatively small effect on the beam angle at all distances from the center of ribbon beam 105. While the beam angles farthest away from the center of ribbon beam 105 will still become more convergent or less divergent based on the effects of the magnetic fields 822, 824, and 826, the adjustments are much smaller than the adjustments made in the previous two examples.

Further, under certain circumstances, such as those discussed above, the beam angle can be reduced to less than 0.5 degrees and thus cause the beamlets to become substantially parallel along the entirety of ribbon beam 105. In particular, as seen in graph 900, when coil current 816 is between 40 A and 50 A, coil current 818 is between 20 A and 30 A, and coil current 820 is between 5 A and 10 A, the beam angle is reduced to less than 0.5 degrees up to 200 mm away from the center of ribbon beam 105. This causes the individual beamlets of ribbon beam 105 to be substantially parallel and travel in a parallel manner. As discussed above, this can help the efficacy of ribbon beam 105 as it impacts a wafer as well as reduce the amount of contamination that occurs to the rest of ion implantation system 100.

In some examples, ion implantation system 100 includes a single dipole magnet 140. For example, ion implantation system 100 may include a long type dipole magnet within processing chamber 130 just before wafer 116. This long type dipole magnet adjusts one or more ribbon beam angles of ribbon beam 105 so that the beamlets of ribbon beam 105 are substantially parallel when implanting wafer 116 and thus implant the correct amount of ions.

As another example, ion implantation system 100 may include a wedge-shaped long type dipole magnet after ion source 102 and before magnetic analyzer 108. This wedge-shaped long type magnet adjusts one or more ribbon beam angles of ribbon beam 105 so that the beamlets of ribbon beam 105 are parallel from the beginning of ribbon beam 105's path through ion implantation system 100. The parallelism of the beamlets of ribbon beam 105 may carry throughout ion implantation system 100 to when ribbon beam 105 contacts wafer 216.

As another example, ion implantation system 100 may include a short type dipole magnet after multipole magnets 110 and before electrode assembly 106 configured to decrease the ribbon beam angle between two beamlets of ribbon beam 105. This short type dipole magnet adjusts the two diverging beamlets such that the ribbon beam angle between the two beamlets is zero and thus the beamlets are parallel. The dipole magnet corrects these beamlets of ribbon beam 105 so that they travel a path parallel to the other beamlets of ribbon beam 105 and will not impact one of the components of ion implantation system 100 like electrode assembly 106. In some examples, the beamlets may diverge because of residual effects of the magnetic fields created by multipole magnets 110 or other magnets present in ion implantation system 100.

In some examples, ion implantation system 100 includes multiple dipole magnets 140 in different locations. For example, ion implantation system 100 may include a first long type dipole magnet configured to increase one or more ribbon beam angles between beamlets of ribbon beam 105 before magnetic analyzer 108 and a second long type dipole magnet configured to decrease one or more ribbon beam angles between beamlets of ribbon beam 105 after magnetic analyzer 108. The first long type dipole magnet increases the ribbon beam angles of ribbon beam 105 causing ribbon beam 105 to expand for processing within magnetic analyzer 108. The second long type dipole magnet decreases the ribbon beam angles of ribbon beam 105 causing ribbon beam 105 to contract when traveling to the next component of ion implantation system 100 to avoid impacting other portions of ion implantation system 100.

As another example, ion implantation system 100 may include the first long type dipole magnet and second long type dipole magnet discussed above in the same locations which perform the same function. Additionally, ion implantation system 100 may include a third long type dipole magnet within processing chamber 130 just before wafer 116. This third long type dipole magnet adjusts one or more ribbon beam angles of ribbon beam 105 so that the beamlets of ribbon beam 105 are substantially parallel when implanting wafer 116 and thus implant the correct amount of ions.

As another example, ion implantation system 100 may include a first long type dipole magnet after ion source 102 and before magnetic analyzer 108 and a second long type dipole magnet within processing chamber 130 just before wafer 116. Both the first and the second long type dipole magnet may be configured to adjust the ribbon beam angles between beamlets of ribbon beam 105 so that the beamlets are substantially parallel. By having magnets configured to accomplish the same goal at multiple points within ion implantation system 100 the system can account for any changes to the paths of the beamlets that may occur in between. This increases consistency of the ion implantation process as the beamlets of ribbon beam 105 may be kept substantially parallel throughout the process.

Figure 10:
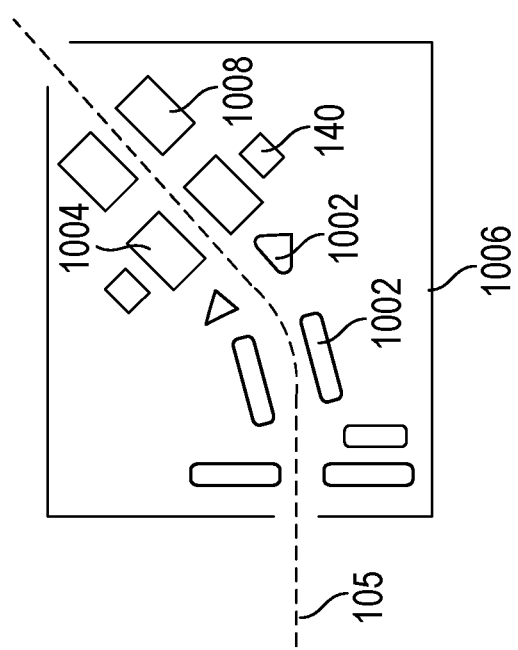
FIG. 10 illustrates an electrode assembly of an ion implantation system and the corresponding ribbon beam, according to various examples.

In some examples, electrode assembly 106 is a single bend beamline assembly 1006, as shown in FIG. 10. Accordingly, in some examples, dipole magnet 140 is placed within single bend beamline assembly 1006 outside of focusing electrodes 1004 placed just after bending and acceleration electrodes 1002. In particular, as ribbon beam 105 enters electrode assembly 1006 ribbon beam 105 passes through several sets of electrodes to bend ribbon beam 105 as well as accelerate or decelerate ribbon beam 105, depending on the current application of ion implantation system 100. As discussed above, in some examples, dipole magnet 140 can be placed before the bending and acceleration electrodes 1002 to ensure that the beamlets of ribbon beam 105 are substantially parallel.

However, dipole magnet 140 can also be placed after the bending and acceleration electrodes 1002, as shown in FIG. 10. In this implementation, dipole magnet 140 is placed outside of focusing electrodes 1004. In some examples, dipole magnet 140 is placed outside of the only pair of focusing electrodes 1004. In other examples, as shown in FIG. 10, dipole magnet 140 is placed outside of a first pair of focusing electrodes 1004 and before a second (or more) pair of focusing electrodes 1008. Placing the dipole magnet 140 outside of focusing electrodes 1004 can provide several benefits, including preventing dipole magnet 140 from taking up space alongside the path of ribbon beam 105. In this way, space can be conserved for other components to interact with ribbon beam 105, while still allowing dipole magnet 140 to act on the individual beamlets of ribbon beam 105 and increase or decrease the beam angle, as described above.

Additionally, by placing dipole magnet 140 after bending and acceleration electrodes 1002, dipole magnet 140 can cause adequate changes to the beam angles of ribbon beam 105 with a smaller amount of coil current. This allows dipole magnet 140 to be more effective against low energy ion beam divergence that is caused by space charge blow-up. Further, this position of dipole magnet 140 allows for any corrections to changes that happen during interaction between ribbon beam 105 and bending and acceleration electrodes 1002, such as causing the beamlets to diverge, converge, or become substantially nonparallel.

Moreover, placing dipole magnet 140 after outside of focusing electrodes 1004 instead of after focusing electrodes 1008, the electromagnetic field created by dipole magnet 140 will interact less with electron showers placed after focusing electrodes 1008 before ribbon beam 105 interacts with the wafer. Thus, dipole magnet 140 will not suppress the electron shower and cause ribbon beam 105 to be less effective when implanting the wafer. Moreover, ferromagnetic material can be inserted into focusing electrodes 1008 to further terminate the magnetic field created by dipole magnet 140 and reduce contamination to the electron shower.

It should be appreciated that the examples discussed before are exemplary and that ion implantation system 100 can include any number of dipole magnets 140 in the various configurations discussed above to adjust the ribbon beam angles of ribbon beam 105 and thus ribbon beam 105 as needed throughout the process of implanting ions in wafer 116.

Figure 11:
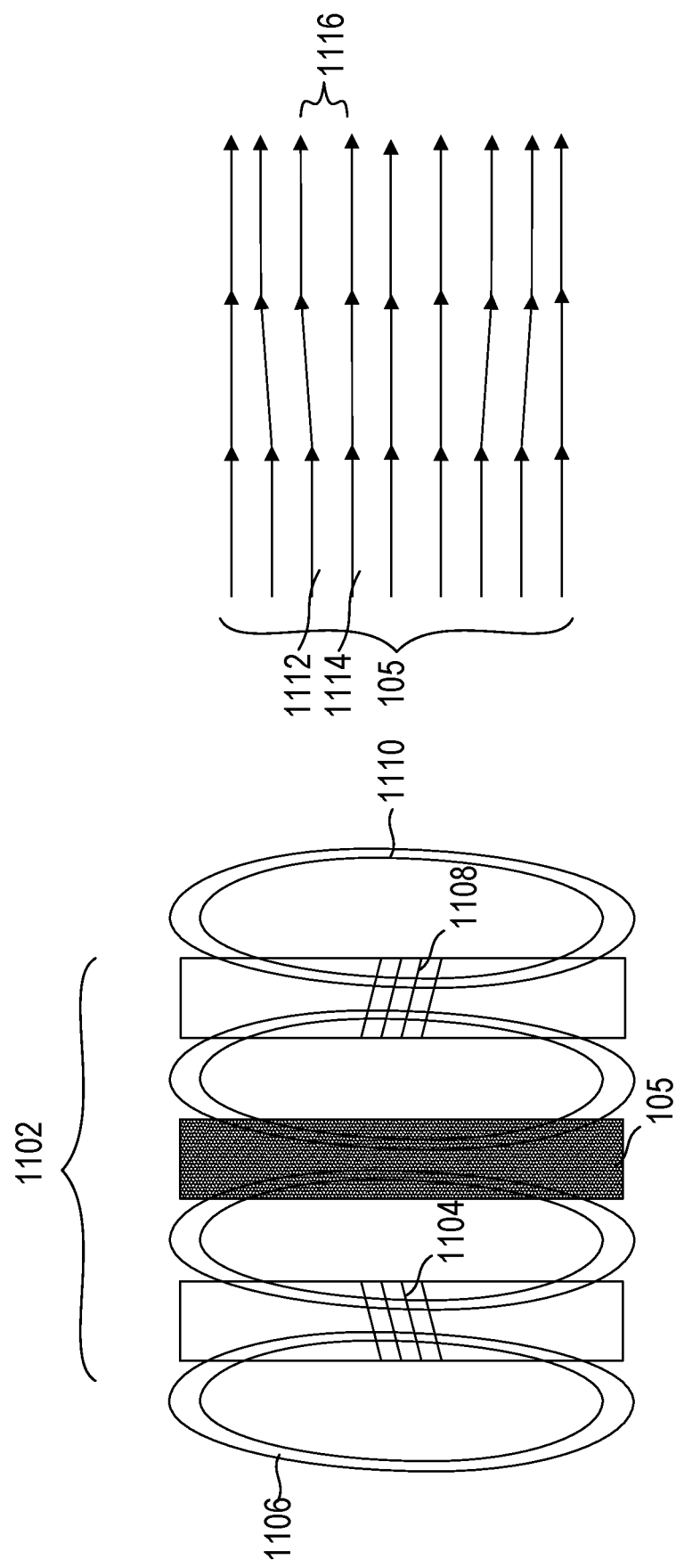
FIG. 11 illustrates a two-dimensional, side perspective view of a quadrupole magnet and the corresponding ribbon beam, according to various examples.

In some examples, ion implantation system 100 optionally includes one or more quadrupole magnets 142 in addition to or instead of dipole magnets 140. In some examples, quadrupole magnets 142 are quadrupole magnet 1102 as shown in FIG. 11. Quadrupole magnet 1102 includes coil 1104 which creates magnetic field 1106 and coil 1108 which creates magnetic field 1110. As shown in FIG. 11, magnetic fields 1106 and 1110 intersect so that both magnetic fields 1106 and 1110 apply different magnetic forces to ribbon beam 105.

The forces applied by magnetic fields 1106 and 1110 cause the beamlets of ribbon beam 105 to converge or diverge depending on the polarity of coils 1104 and 1108. In particular, as describe above with respect to dipole magnet 140, quadrupole magnet 1102 may be configured to create magnetic fields 1106 and 1110 which cause beamlets 1112 and 1114 to separate and move further from the center of ribbon beam 105. Accordingly, when quadrupole magnet 1102 is configured in this way ribbon beam angle 1116 increases.

Similarly, quadrupole magnet 1102 may be configured to create magnetic fields 1106 and 1110 which cause beamlets 1112 and 1114 to move closer together towards the center of ribbon beam 105. Accordingly, when quadrupole magnet 1102 is configured in this way ribbon beam angle 1116 decreases. In some examples, quadrupole magnet 1102 is configured to create magnetic fields 1106 and 1110 which cause beamlets 1112 and 1114 to separate or more closer together to cause beamlets 1112 and 1114 to become substantially parallel. Accordingly, when quadrupole magnet 1102 is configured in this way ribbon beam angle 1116 can increase or decrease to become zero, coinciding with beamlets 1112 and 1114 becoming substantially parallel.

In addition to affecting the spread of beamlets 1112 and 1114, magnetic fields 1106 and 1110 also cause the beamlets of ribbon beam 105 stretch and become wider due to the magnetic forces created by the intersecting magnetic fields. In this way, in addition to the ability to adjust ribbon beam angle 1116 and other ribbon beam angles of ribbon beam 105, quadrupole magnet 1102 can also affect the overall shape and width of ribbon beam 105. Thus, quadrupole magnet 1102 can increase or decrease the exposure of wafer 116 or other components of ion implantation system 100 to the beamlets and charged ions of ribbon beam 105.

Returning to FIG. 1, similarly to dipole magnets 140, quadrupole magnets 142 may be placed in any location along the path of ribbon beam 105. Thus, quadrupole magnets 142 may be placed before components like magnetic analyzer 108 to cause the beamlets of ribbon beam 105 to diverge and increase the exposure of the beamlets to the magnetic field of magnetic analyzer 108. Quadrupole magnets 142 may also be placed after components like magnetic analyzer 108 to cause the beamlets of ribbon beam 105 to converge and take a clear path through ion implantation system 100 to avoid collision with other components of ion implantation system 100. Further, quadrupole magnets 142 can be placed between multipole magnets 110 and 114 and before wafer 116 to cause the beamlets of ribbon beam 105 to become substantially parallel and thus ensure the correct exposure of wafer 116 to the ions of ribbon beam 105.

It will further be appreciated that ion implantation system 100 can include any combination of quadrupole magnets 142 and dipole magnets 140 at various locations within ion implantation system 100. For example, ion implantation system 100 can include a quadrupole magnet 142 before magnetic analyzer 108 to cause the beamlets of ribbon beam 105 to diverge, a quadrupole magnet 142 after magnetic analyzer 108 to cause the beamlets of ribbon beam 105 to converge, and a quadrupole magnet 142 before wafer 116 to cause the beamlets of ribbon beam 105 to become parallel. As another example, ion implantation system 100 may include a dipole magnet 140 before magnetic analyzer 108 to cause the beamlets of ribbon beam 105 to diverge, a quadrupole magnet 142 after magnetic analyzer 108 to cause the beamlets of ribbon beam 105 to converge, a dipole magnet 140 before multiple magnet 114 to cause the beamlets to become parallel, and a quadrupole magnet 142 before the wafer to correct and beamlets that are no longer parallel.

Further, it should be appreciated that suitable variations and modifications may be made to ion implantation system 100. For example, ion implantation system 100 can include additional components such as additional electrodes and magnets for manipulating ribbon beam 105. As another example, ion implantation system 100 can include more than one variable aperture assembly for controlling the current of ribbon beam 105. Note, as shown in FIG. 1, all of the components of ion implantation system 100 are positioned outside of the processing chamber of ion implantation system 100 (e.g., processing chamber 130) except wafer 116, wafer chuck 118, and dipole magnets 140 (which are positioned within an interior of the processing chamber). In some examples, components of ion implantation system 100 that are outside of ion implantation system 100's processing chamber are coupled to an exterior surface of processing chamber 130. In some examples, components of ion implantation system 100 that are outside of ion implantation system 100's processing chamber are positioned near the processing chamber but are not coupled to the processing chamber. In any case, the components of ion implantation system 100 that are positioned outside of ion implantation system 100's processing chamber are positioned and configured in such a way that allows ribbon beam 105 to enter processing chamber 130 while maintaining an interior of processing chamber 130 at a high vacuum.

As mentioned above, ion implantation system 100 further includes controller 132. Controller 132 can be implemented on one or more standalone data processing devices or a distributed network of computers. Further, although controller 132 is illustrated as a single controller in FIG. 1, one of ordinary skill in the art would appreciate that controller 132 can include any number of controllers necessary to perform the controller 132 processes and functions disclosed herein.

As shown, controller 132 includes memory 134, processor(s) 136, and input/output (I/O) interface 138. I/O interface 138 facilitates input and output processing for controller 132. For example, I/O interface 138 can facilitate input and output processing for one or more input devices (e.g., a keyboard, mouse, etc.) and/or one or more output devices (e.g., a display) that are communicatively connected to controller 132 (e.g., via one or more wired connections) and that an operator of ion implantation system 100 can use to observe and control the processes and functions of controller 132. Processor(s) 136 utilize memory 134 to execute the instructions stored therein. In some examples, memory 134 includes random access memory (RAM), including but not limited to volatile RAM (e.g., DRAM, SRAM) and non-volatile RAM (e.g., NAND). In some examples, memory 134 further includes computer-readable storage media. In some examples, the computer-readable storage media are tangible and non-transitory. For example, memory 134 can include high-speed random access memory and can also include non-volatile memory, such as one or more magnetic disk storage devices, flash memory devices, or other non-volatile solid-state memory devices. In some examples, the computer-readable storage media of memory 134 store one or more programs for execution by processor(s) 136, the one or more programs including instructions for performing any of the methods and processes described herein (e.g., with reference to FIG. 12).

In some examples, controller 132 is configured to determine whether beamlets of ribbon beam 105 are parallel and in accordance with a determination that the beamlets are not parallel, adjust one or more magnetic fields created by dipole magnets 140. In some examples, controller 132 may monitor the parallelism of the beamlets and make adjustments to the magnetic fields automatically in real time. That is, controller 132 may determine whether one or more beamlets of ribbon beam 105 are impacting a surface they should not be impacting and adjust the configuration of dipole magnet 140 to correct the path of the beamlet. In some examples, controller 132 may determine whether one or more beamlets of ribbon beam 105 is not parallel after ribbon beam 105 implants wafer 116. For example, controller 132 may contact one or more sensors included in processing chamber 130 to determine what portion of the beamlets of ribbon beam 105 impacted the wafer and adjust dipole magnet 140 accordingly.

In some examples, controller 132 adjusts the magnetic field created by dipole magnet 140 by adjusting a current applied to dipole magnet 140. For example, controller 132 may determine that the strength of the magnetic field should be increased based on the current of ribbon beam 105 and thus may increase the current applied to dipole magnet 140. In some examples, controller 132 adjusts the magnetic field created by dipole magnet 140 by adjusting multiple currents applied to dipole magnet 140. For example, controller 132 may determine that the strength of the magnetic field should be increased on one portion but kept the same on another portion. Accordingly, controller 132 may increase the first current applied to dipole magnet 140 related to the first portion of the magnetic field and keep the second current applied to dipole magnet 140 related to the second portion of the magnetic field the same.

In some examples, controller 132 adjusts the magnetic field created by dipole magnet 140 by adjust a gap of the dipole magnet. For example, controller 132 may determine that the strength of the magnetic field should be increased based on the current of ribbon beam 105 and thus may move the two portions of dipole magnet 140 closer together to adjust the gap of dipole magnet 140 and thus the magnetic field created.

Figure 12:
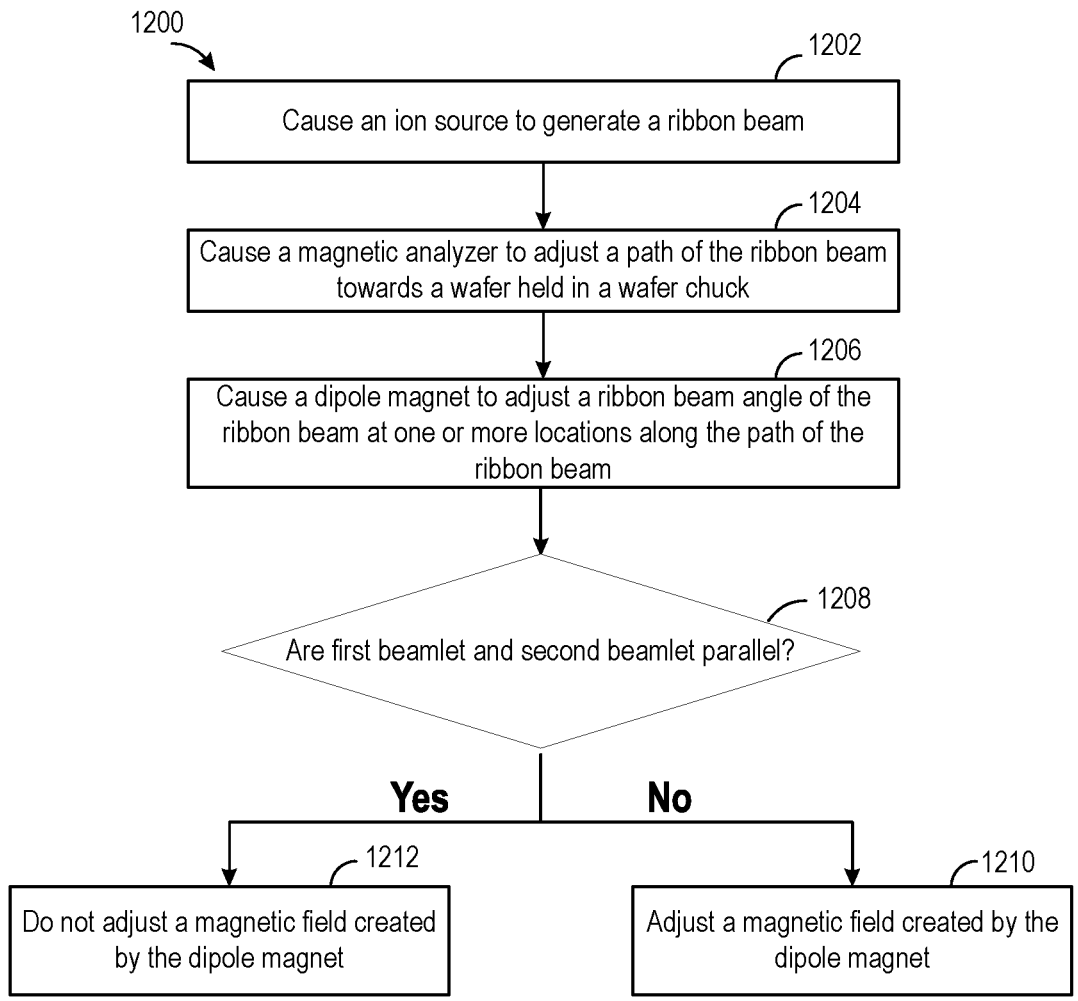
FIG. 12 illustrates a process for providing a ribbon beam to a wafer with an ion implantation system, according to various examples.

FIG. 12 illustrates a process for providing a ribbon beam to a wafer in an ion implantation system, according to various examples. In some examples, process 1200 is performed by a system similar or identical to system 100, described above with reference to FIGS. 1-11. Process 1200 is described below with simultaneous reference to FIGS. 1-11.

At step 1202, process 1200 causes an ion source (e.g., ion source 102) of an ion implantation system (e.g., ion implantation system 100) to generate a ribbon beam (e.g., ribbon beam 105) In some examples, the ribbon beam includes a first beamlet (e.g., beamlet 506, 508, 606, 608, 612, 614, 706, 708, 830, 832, 834, 836, 838, 840, 1112, and 1114) and a second beamlet (e.g., beamlet 506, 508, 606, 608, 612, 614, 706, 708, 830, 832, 834, 836, 838, 840, 1112, and 1114) and a ribbon beam angle (e.g., ribbon beam angle 304, 404, 510, 610, 616, 710, 831, 833, 839, and 1116) between the first beamlet and the second beamlet. In some examples, the ribbon beam includes a third beamlet (e.g., beamlet 506, 508, 606, 608, 612, 614, 706, 708, 830, 832, 834, 836, 838, 840, 1112, and 1114) and a fourth beamlet (e.g., beamlet 506, 508, 606, 608, 612, 614, 706, 708, 830, 832, 834, 836, 838, 840, 1112, and 1114) and a second ribbon beam angle (e.g., ribbon beam angle 304, 404, 510, 610, 616, 710, 831, 833, 839, and 1116) between the third beamlet and the first beamlet. In some examples, the first beamlet and the second beamlet are adjacent beamlets. Similarly, the third beamlet and the fourth beamlet are adjacent beamlets. In some examples, the first beamlet and the second beamlet are opposite the third beamlet and the fourth beamlet.

At step 1204, process 1200 causes a magnetic analyzer (e.g., magnetic analyzer 108) to adjust a path of the ribbon beam (e.g., ribbon beam 105) towards a wafer (e.g., wafer 116) held in a wafer chuck (e.g., wafer chuck 118) of the ion implantation system (e.g., ion implantation system 100). In some examples, one or more other components (e.g., multipole magnets 110, electrode assembly 106, multipole magnets 114, and variable aperture assembly 112) of ion implantation system (e.g., ion implantation system 100) interact with the ribbon beam along the path of the ribbon beam towards the wafer.

At step 1206, process 1200 causes the dipole magnet (e.g., dipole magnet 140, 200, 302, 402, 502, 602, 702, and 802) to adjust the ribbon beam angle (e.g., ribbon beam angle 304, 404, 510, 610, 616, 710, 831, 833, 839, and 1116) of the ribbon beam (e.g., ribbon beam 105) at one or more locations along the path of the ribbon beam (e.g., ribbon beam 105). In some examples the gap of the dipole magnet is determined based on at least one of an energy or a mass of the ribbon beam. In some examples, the dipole magnets adjusts the second ribbon beam angle (e.g., ribbon beam angle 304, 404, 510, 610, 616, 710, 831, 833, 839, and 1116) between the third beamlet (e.g., beamlet 506, 508, 606, 608, 612, 614, 706, 708, 830, 832, 834, 836, 838, 840, 1112, and 1114) and the fourth beamlet (e.g., beamlet 506, 508, 606, 608, 612, 614, 706, 708, 830, 832, 834, 836, 838, 840, 1112, and 1114). In some examples, the dipole magnet includes at least two coils (e.g., coil 804, 806, 808, 810, 812, and 814). In some examples, a first current (e.g., current 816, 818, and 820) is applied to a first coil (e.g., coil 804, 806, 808, 810, 812, and 814) of the at least two coils and a second current (e.g., current 816, 818, and 820) is applied to a second coil (e.g., coil 804, 806, 808, 810, 812, and 814) of the at least two coils. In some examples, the first current and the second current are the same. In some examples, the first current is less than the second current. In some examples, the second current is less than the first current.

In some examples, the dipole magnet (e.g., dipole magnet 140, 200, 302, 402, 502, 602, 702, and 802) decreases the ribbon beam angle (e.g., ribbon beam angle 304, 404, 510, 610, 616, 710, 831, 833, 839, and 1116). In some examples, the dipole magnet increases the ribbon beam angle. In some examples, the dipole magnet is a long type dipole magnet and adjust the first beamlet (e.g., beamlet 506, 508, 606, 608, 612, 614, 706, 708, 830, 832, 834, 836, 838, 840, 1112, and 1114) and the second beamlet (e.g., beamlet 506, 508, 606, 608, 612, 614, 706, 708, 830, 832, 834, 836, 838, 840, 1112, and 1114) to be substantially parallel. In some examples, the dipole magnet is a wedge-shaped magnet. In some examples, the first beamlet and the third beamlet (e.g., beamlet 506, 508, 606, 608, 612, 614, 706, 708, 830, 832, 834, 836, 838, 840, 1112, and 1114) are parallel after passing through the dipole magnet.

In some examples, the dipole magnet (e.g., dipole magnet 140, 202, 302, 402, 502, 602, 702, and 802) is disposed between the ion source (e.g., ion source 102) and a magnetic analyzer (e.g., magnetic analyzer 108) of the ion implantation system (e.g., ion implantation system 100). In some examples, a second dipole magnet (e.g., dipole magnet 140, 202, 302, 402, 502, 602, 702, and 802) is disposed between the magnetic analyzer and a multipole magnet (e.g., multipole magnet 110, 114). In some examples, the first dipole magnet increases the ribbon beam angle (e.g., ribbon beam angle 304, 404, 510, 610, 616, 710, 831, 833, 839, and 1116) and the second dipole magnet decreases the ribbon beam angle. In some examples, a third dipole magnet (e.g., dipole magnet 140, 202, 302, 402, 502, 602, 702, and 802) adjusts the first beamlet (e.g., beamlet 506, 508, 606, 608, 612, 614, 706, 708, 830, 832, 834, 836, 838, 840, 1112, and 1114) and the second beamlet (e.g., beamlet 506, 508, 606, 608, 612, 614, 706, 708, 830, 832, 834, 836, 838, 840, 1112, and 1114) to be substantially parallel.

At step 1208, a controller (e.g., controller 132) determines whether the first beamlet (e.g., beamlet 506, 508, 606, 608, 612, 614, 706, 708, 1112, and 1114) and the second beamlet (e.g., beamlet 506, 508, 606, 608, 612, 614, 706, 708, 830, 832, 834, 836, 838, 840, 1112, and 1114) are parallel. At step 910, in accordance with a determination that the first beamlet and the second beamlet are not parallel, the controller adjusts a magnetic field (e.g., magnetic field 202, 304, 404, 504, 604, 704, 822, 824, and 826) created by the dipole magnet (e.g., dipole magnet 140, 202, 302, 402, 502, 602, 702, and 802). In some examples, the magnetic field created by the dipole magnet is adjusted by adjusting a current applied to the dipole magnet. In some examples, the magnetic field created by the dipole magnet is adjusted by adjusting a gap of the dipole magnet.

At step 1212, in accordance with a determination that the first beamlet (e.g., beamlet 506, 508, 606, 608, 612, 614, 706, 708, 830, 832, 834, 836, 838, 840, 1112, and 1114) and the second beamlet (e.g., beamlet 506, 508, 606, 608, 612, 614, 706, 708, 830, 832, 834, 836, 838, 840, 1112, and 1114) are parallel, the controller does not adjust a magnetic field (e.g., magnetic field 202, 304, 404, 504, 604, 704, 822, 824, and 826) created by the dipole magnet (e.g., dipole magnet 140, 202, 302, 402, 502, 602, 702, and 802).

In some examples, the controller (e.g., controller 132) is configured to determine whether the first ribbon beam angle (e.g., ribbon beam angle 304, 404, 510, 610, 616, 710, 831, 833, 839, and 1116) is a divergent beam angle. If the first ribbon beam angle is a divergent beam angle the controller is configured to increase the first current (e.g., current 816, 818, and 820) applied to the first coil (e.g., coil 804, 806, 808, 810, 812, and 814). In some examples, the controller determines whether the first ribbon beam angle is a divergent beam angle by determining whether the ribbon beam angle is above a predetermined threshold (e.g., 1, 1.5, 2, 5, or 10 degrees).

In some examples, the controller (e.g., controller 132) is configured to determine whether the first ribbon beam angle (e.g., ribbon beam angle 304, 404, 510, 610, 616, 710, 831, 833, 839, and 1116) is a convergent beam angle. If the first ribbon beam angle is a convergent beam angle the controller is configured to increase the second current (e.g., current 816, 818, and 820) applied to the second coil (e.g., coil 804, 806, 808, 810, 812, and 814). In some examples, the controller determines whether the first ribbon beam angle is a convergent beam angle by determining whether the ribbon beam angle is below a predetermined threshold (e.g., 1, 1.5, 2, 5, or 10 degrees).

In some examples, an electrode assembly (e.g., electrode assembly 106) is disposed between the ion source (e.g., ion source 102) and the wafer chuck (e.g., wafer chuck 118) and the electrode assembly is a single bend beamline assembly (e.g., electrode assembly 1006). In some examples the dipole magnet (e.g., dipole magnet 140, 202, 302, 402, 502, 602, 702, and 802) is disposed within the electrode assembly. In some examples, the dipole magnet is disposed on the outside of a focusing electrode (e.g., focusing electrode 1004) of the electrode assembly.

It should be appreciated that some steps in process 1200 may be combined, the order of some steps can be changed, and some steps can be omitted. Further, it should be appreciated that additional steps may be performed. For example, if the ion implantation system 100 includes additional dipole magnets, process 1200 may additionally include a step for adjust the ion beam with the one or more additional dipole magnets.

While specific components, configurations, features, and functions are provided above, it will be appreciated by one of ordinary skill in the art that other variations may be used. Additionally, although a feature may appear to be described in connection with a particular example, one skilled in the art would recognize that various features of the described examples may be combined. Moreover, aspects described in connection with an example may stand alone.

Although embodiments have been fully described with reference to the accompanying drawings, it should be noted that various changes and modifications will be apparent to those skilled in the art. Such changes and modifications are to be understood as being included within the scope of the various examples as defined by the appended claims.

What is claimed is:

1. A method for providing a ribbon beam to a wafer in an ion implantation system, the ion implantation system including an ion source, a wafer chuck configured to hold the wafer, a dipole magnet including at least two coils disposed between the ion source and the wafer chuck, and a controller configured to control the ion source, the wafer chuck, and the dipole magnet, the method comprising:
   delivering the ribbon beam with the ion source to the wafer held in the wafer chuck; and
   adjusting a ribbon beam angle of the ribbon beam with the dipole magnet at one or more locations along a path of the ribbon beam between the ion source and the wafer held in the wafer chuck by applying a first current to a first coil of the at least two coils and a second current to a second coil of the at least two coils, wherein the ribbon beam angle is an angle between a first beamlet and a second beamlet of the ribbon beam, wherein the first beamlet and the second beamlet are adjacent beamlets of the ribbon beam, and wherein a gap of the dipole magnet is determined based on at least one of an energy or a mass of the ribbon beam.

2. The method of claim 1, further comprising:
   adjusting the gap of the dipole magnet based on the at least one of the energy or the mass of the ribbon beam.

3. The method of claim 1, wherein adjusting the ribbon beam angle of the ribbon beam further comprises:
   increasing the first current applied to the first coil while maintaining the second current applied to the second coil.

4. The method of claim 1, wherein adjusting the ribbon beam angle of the ribbon beam further comprises:
   decreasing the first current applied to the first coil while maintaining the second current applied to the second coil.

5. The method of claim 1, wherein adjusting the ribbon beam angle of the ribbon beam further comprises:
   increasing the second current applied to the second coil while maintaining the first current applied to the first coil.

6. The method of claim 1, wherein adjusting the ribbon beam angle of the ribbon beam further comprises:
   increasing the first current applied to the first coil; and
   increasing the second current applied to the second coil.

7. The method of claim 1, wherein adjusting the ribbon beam angle of the ribbon beam further comprises:
   maintaining the first current applied to the first coil; and
   maintaining the second current applied to the second coil such that the first beamlet and the second beamlet are substantially parallel.

8. The method of claim 1, further comprising:
   bending the path of the ribbon beam with a single bend beamline assembly prior to adjusting the ribbon beam angle of the ribbon beam, wherein the dipole magnet is included in the single bend beamline assembly.

9. The method of claim 1, wherein the dipole magnet is a first dipole magnet placed at a first location along the path of the ribbon beam, further comprising:
adjusting the ribbon beam angle of the ribbon beam with a second dipole magnet placed at a second location along the path of the ribbon beam.

10. The method of claim 8, wherein the second dipole magnet adjusts the ribbon beam angle after the first dipole magnet.

11. The method of claim 8, wherein the second dipole magnet adjusts the ribbon beam angle before the first dipole magnet.

12. The method of claim 1, further comprising:
determining whether the first beamlet and the second beamlet are parallel; and
in accordance with a determination that the first beamlet and the second beamlet are not parallel, adjusting a first magnetic field created by the dipole magnet.

13. A method for providing a ribbon beam to a wafer in an ion implantation system, the ion implantation system including an ion source, a wafer chuck configured to hold the wafer, a dipole magnet including at least two coils disposed between the ion source and the wafer chuck, and a controller configured to control the ion source, the wafer chuck, and the dipole magnet, the method comprising:
delivering the ribbon beam with the ion source to the wafer held in the wafer chuck;
adjusting a ribbon beam angle of the ribbon beam with the dipole magnet at one or more locations along a path of the ribbon beam between the ion source and the wafer held in the wafer chuck by applying a first current to a first coil of the at least two coils and a second current to a second coil of the at least two coils, wherein the ribbon beam angle is an angle between a first beamlet and a second beamlet of the ribbon beam, and wherein the first beamlet and the second beamlet are adjacent beamlets of the ribbon beam;
determining whether the ribbon beam angle is a divergent angle; and
in accordance with a determination that the ribbon beam angle is a divergent angle, increasing the first current applied to the first coil.

14. A method for providing a ribbon beam to a wafer in an ion implantation system, the ion implantation system including an ion source, a wafer chuck configured to hold the wafer, a dipole magnet including at least two coils disposed between the ion source and the wafer chuck, and a controller configured to control the ion source, the wafer chuck, and the dipole magnet, the method comprising:
delivering the ribbon beam with the ion source to the wafer held in the wafer chuck;
adjusting a ribbon beam angle of the ribbon beam with the dipole magnet at one or more locations along a path of the ribbon beam between the ion source and the wafer held in the wafer chuck by applying a first current to a first coil of the at least two coils and a second current to a second coil of the at least two coils, wherein the ribbon beam angle is an angle between a first beamlet and a second beamlet of the ribbon beam, and wherein the first beamlet and the second beamlet are adjacent beamlets of the ribbon beam;
determining whether the ribbon beam angle is a convergent angle; and
in accordance with a determination that the ribbon beam angle is a convergent angle, increasing the second current applied to the second coil.

15. An ion implantation system for providing a ribbon beam to a wafer comprising:
an ion source configured to generate the ribbon beam;
a wafer chuck configured to hold the wafer during implantation by the ribbon beam;
a dipole magnet disposed between the ion source and the wafer chuck, wherein the dipole magnet includes at least two coils configured to adjust a ribbon beam angle of the ribbon beam at one or more locations along a path of the ribbon beam between the ion source and the wafer held in the wafer chuck, wherein a first current is applied to a first coil of the at least two coils and wherein a second current is applied to a second coil of the at least two coils, wherein the ribbon beam angle is an angle between a first beamlet and a second beamlet of the ribbon beam, wherein the first beamlet and the second beamlet are adjacent beamlets of the ribbon beam, and wherein a gap of the dipole magnet is determined based on at least one of an energy or a mass of the ribbon beam; and
a controller configured to control the ion source, the wafer chuck, and the dipole magnet.

16. The ion implantation system of claim 15, wherein the gap of the dipole magnet is tunable based on the at least one of the energy or the mass of the ribbon beam.

17. The ion implantation system of claim 15, wherein the dipole magnet is configured to decrease the ribbon beam angle.

18. The ion implantation system of claim 15, wherein the dipole magnet is configured to increase the ribbon beam angle.

19. The ion implantation system of claim 15, wherein the dipole magnet is a long type dipole magnet and is configured to adjust the first beamlet and the second beamlet to be substantially parallel.

20. The ion implantation system of claim 19, wherein the dipole magnet is a wedge-shaped magnet.

21. The ion implantation system of claim 15, wherein the ribbon beam further comprises a third beamlet and a fourth beamlet that are adjacent beamlets of the ribbon beam and are opposite the first beamlet and the second beamlet.

22. The ion implantation system of claim 21, wherein the dipole magnet is configured to adjust a second ribbon beam angle between the third beamlet and the first beamlet of the ribbon beam.

23. The ion implantation system of claim 22, wherein the first beamlet and the third beamlet are parallel after passing through the dipole magnet.

24. The ion implantation system of claim 15, further comprising a magnetic analyzer disposed between the ion source and the wafer chuck, wherein the dipole magnet is disposed between the ion source and the magnetic analyzer.

25. The ion implantation system of claim 24, wherein the dipole magnet is a first dipole magnet, further comprising:
a multipole magnet disposed between the magnetic analyzer and the wafer chuck; and
a second dipole magnet disposed between the magnetic analyzer and the multipole magnet.

26. The ion implantation system of claim 25, wherein the first dipole magnet is configured to increase the ribbon beam angle and the second dipole magnet is configured to decrease the ribbon beam angle.

27. The ion implantation system of claim 25, further comprising:
a third dipole magnet disposed between the multipole magnet and the wafer chuck, wherein the third dipole magnet is configured to adjust the first beamlet and the second beamlet to be substantially parallel.

28. The ion implantation system of claim 15, wherein the controller is configured to:
determine whether the first beamlet and the second beamlet are parallel; and
in accordance with a determination that the first beamlet and the second beamlet are not parallel, adjusting a first magnetic field created by the dipole magnet.

29. The ion implantation system of claim 28, wherein the first magnetic field created by the dipole magnet is adjusted by adjusting the first current applied to the first coil.

30. The ion implantation system of claim 28, wherein the first magnetic field created by the dipole magnet is adjusted by adjusting a gap of the dipole magnet.

31. The ion implantation system of claim 15, wherein the controller is configured to:
determine whether the first ribbon beam angle is a divergent beam angle; and
in accordance with a determination that the first beam angle is a divergent beam angle, increasing the first current applied to the first coil.

32. The ion implantation system of claim 16, wherein the controller is configured to:
determine whether the first ribbon beam angle is a convergent beam angle; and
in accordance with a determination that the first beam angle is a convergent beam angle, increasing the second current applied to the second coil.

33. The ion implantation system of claim 15, further comprising an electrode assembly disposed between the ion source and the wafer chuck, wherein the electrode assembly is a single bend beamline assembly, and wherein the dipole magnet is disposed within the electrode assembly.

34. The ion implantation system of claim 33, wherein the dipole magnet is disposed on the outside of a focusing electrode of the electrode assembly.

35. A non-transitory computer-readable storage medium storing one or more programs, the one or more programs comprising instructions, which when executed by one or more processors of a controller of an ion implantation system, cause the controller to:
cause an ion source of the ion implantation system to generate a ribbon beam;
adjust a path of the ribbon beam towards a wafer held in a wafer chuck of the ion implantation system with a magnetic analyzer of the ion implantation system; and
adjust a ribbon beam angle of the ribbon beam with a dipole magnet including at least two coils at one or more locations along the path of the ribbon beam between the ion source and the wafer held in the wafer chuck, wherein a first current is applied to a first coil of the at least two coils and a second current is applied to a second coil of the at least two coils, wherein the ribbon beam angle is an angle between a first beamlet and a second beamlet of the ribbon beam, wherein the first beamlet and the second beamlet are adjacent beamlets of the ribbon beam, and wherein a gap of the dipole magnet is determined based on at least one of an energy or a mass of the ribbon beam.

* * * * *